US006476607B1

(12) United States Patent
Dannels et al.

(10) Patent No.: US 6,476,607 B1
(45) Date of Patent: Nov. 5, 2002

(54) MRI METHOD AND APPARATUS FOR RAPID ACQUISITION OF MULTIPLE VIEWS THROUGH A VOLUME

(75) Inventors: Wayne R. Dannels, Richmond Heights; Michael R. Thompson, Cleveland Heights, both of OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/732,815

(22) Filed: Dec. 8, 2000

(51) Int. Cl.⁷ .................................................. G01V 3/00
(52) U.S. Cl. ....................................... 324/309; 324/307
(58) Field of Search ............................... 324/309, 307

(56) References Cited

U.S. PATENT DOCUMENTS

| | | | | |
|---|---|---|---|---|
| 4,871,966 A | | 10/1989 | Smith et al. ................. | 324/309 |
| 4,984,157 A | * | 1/1991 | Cline et al. ................. | 324/309 |
| 5,078,141 A | | 1/1992 | Suzuki ........................ | 600/422 |
| 5,243,284 A | * | 9/1993 | Noll ........................... | 324/309 |
| 5,311,133 A | | 5/1994 | Dannels ....................... | 324/309 |
| 5,708,359 A | | 1/1998 | Gregory ....................... | 324/309 |
| 5,749,834 A | * | 5/1998 | Hushek ........................ | 324/309 |
| 5,786,692 A | * | 7/1998 | Maier et al. ................. | 324/307 |
| 5,926,021 A | * | 7/1999 | Hennig ........................ | 324/309 |

OTHER PUBLICATIONS

Atalar, et al. "Catheter–Tracking FOV MR Fluoroscopy", MRM 40:865–872 (1998).
Chen "Sterescopic NMR Imaging–Encoding Depth Information by Non–Linear Gradients", p 1980.
Coutts, et al. "Integrated and Interactive Position Tracking and Imaging of Interventional Tools and Internal Devices Using Small Fiducial Receiver Coils", MRM 40:908–913 (1998).
Dumoulin, et al. "Real–Time Position Monitoring of Invasive Devices Using Magnetic Resonance", MRM 29:411–415 (1993).
Epstein, et al. "Segmented k–Space Fast Cardiac Imaging Using an Echo–Train Readout", Magnetic Resonance in Medicine 41:609–613 (1999).
Fernando "Space 701 –Stereoscopic Presentation of MR Images", Radiology Nov. 1985 vol. 157(P) Chicago Nov. 17–22, 1985.
Gregory, et al. "Interactive Stereoscopic MRI with the NmrScope", Proceedings of the ISMRM 4th Meeting & Exhib., Apr. 27–May 3, 1996 vol. 3, p. 1601.
Guttman, et al. "Fast Stereoscopic MRI For Clinical Procedures", Proceedings of the ISMRM 8th Meeting & Exhib., Apr. 1–Apr. 7, 2000 vol. 1, p. 67.
Henri, et al. "Three–Dimensional Reconstruction of Vascular Trees. Theory and Methodology", Med. Phys 23 (2), Feb. 1996, pp. 197–204.

(List continued on next page.)

Primary Examiner—Edward Lefkowitz
Assistant Examiner—Dixomara Vargas
(74) Attorney, Agent, or Firm—Fay, Sharpe, Fagan, Minnich & McKee, LLP

(57) ABSTRACT

A magnetic resonance imaging apparatus and method employ a magnet system (12) creating a temporally constant magnetic field through an examination region (14) in which at least a portion of an object to be imaged is placed. A radio frequency (RF) excitation system (24, 26) applies an RF excitation to a volume of interest of the object to be imaged, and a receiver system (32) detects and demodulates magnetic resonance data from the volume of interest. A magnetic field encoding system (20, 22, 40) applies encoding magnetic fields to provide spatial discrimination of magnetic resonance data from the volume of interest within a single radio frequency excitation period. The spatial encoding of the magnetic resonance signal data is performed and collected along a preselected k-space trajectory, the k-space trajectory covering a plurality of intersecting planes or partial planes of k-space data.

30 Claims, 15 Drawing Sheets

OTHER PUBLICATIONS

Henri, et al. "Three–Dimensional Reconstruction of Vascular Trees: Expermental Evaluation", Med. Phys 23 (5), My 1996, pp. 617–627.

Kollias, et al. "Sterescopic and Virtual Endoscopic MR Imaging of Intracranial Aneurysms", Proceedings of the ISMRM 6th Meeting & Exhib., Apr. 18–Apr. 24, 1998 vol. 2, p. 1283.

Moseley, et al. "Stereoscopic MR Imaging", Journ. of Computer Assisted Tomogrpahy 13(1):167–173 Jan./Feb. 1989.

Peters, et al. "Stereoscopic Visualization of 3–D MR Images for Neurosurgical Guidance", Proceedings of the SRM 3rd Meeting & Exhib. & European Society for Mag. Res. in Medicine & Biology, Aug. 19–25, 1995 vol. 2.

Peters, et al. "Merging 3–D MRI Data with Stereoscopic Video Images", Proceedings of the SRM 3rd Meeting & Exhib. & European Society for Magnetic Resonance in Medicine & Biology, Aug. 19–25, 1995 vol. 2, p. 1168.

Rasche, et al. "Acquisition of Fast Stereoscopic MR Roadmaps", Proceedings of the ISMRM 6th Meeting & Exhib., Apr. 18–24, 1998 vol. 2, p. 789.

Wentz, "Stereoscopic Display of MR Angiograms", Neuroradiology (1991) 33:123–125.

Wong, et al. "Stereoscopically Guided Characterization of Three–Dimensional Dynamic MR Images of the Breast", Radiology 1996; 198:288–291.

* cited by examiner

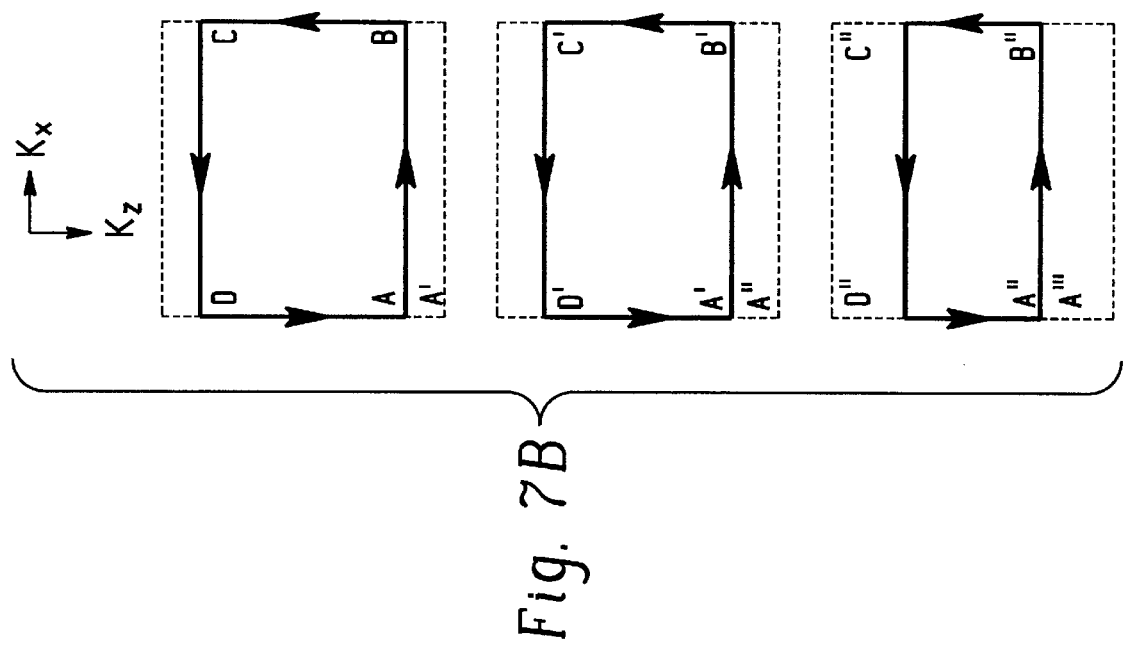
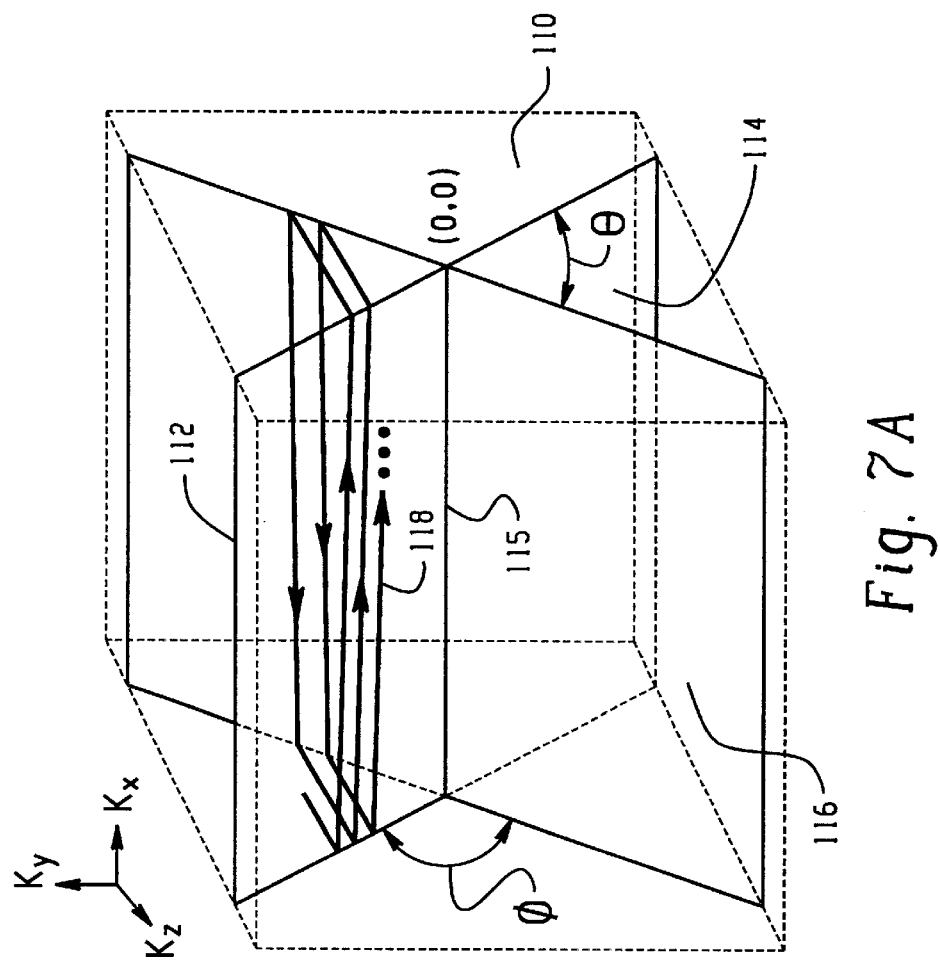
Fig. 7B
Fig. 7A

MRI METHOD AND APPARATUS FOR RAPID ACQUISITION OF MULTIPLE VIEWS THROUGH A VOLUME

BACKGROUND OF THE INVENTION

The present application relates to the magnetic resonance imaging arts. It finds particular application to a magnetic resonance imaging apparatus and method that efficiently provides depth information by reading out a selected number of planes in k-space, each plane of data representing a view or projection through a volume of interest, and will be described with particular reference thereto. However, the technique may also find application in other magnetic resonance imaging techniques.

Magnetic resonance imaging (MRI) is a noninvasive imaging technique that provides clinicians and diagnosticians with information about the anatomical structure and condition of a region of interest within a subject. Commonly, in MRI, a substantially uniform temporally constant main magnetic field ($B_0$) is set up in an examination region in which a subject being imaged or examined is placed. Via radio frequency (RF) magnetic field ($B_1$) excitation and manipulations, selected magnetic dipoles in the subject which are otherwise aligned with the main magnetic field are tipped to excite magnetic resonance. The resonance is typically manipulated to induce detectable magnetic resonance echoes from a selected region of the subject. In imaging, the echoes are spatially encoded via magnetic gradients set up in the main magnetic field. The raw data from the MRI scanner is collected into a matrix, commonly known as k-space. By employing inverse Fourier, two-dimensional Fourier, three-dimensional Fourier, or other known transformations, an image representation of the subject is reconstructed from the k-space data.

There are many applications in which depth or 3D information is useful for diagnosis and formulation of treatment strategies. For example, in imaging blood vessels, cross-sections merely show slices through vessels, making it difficult to diagnose stenosis or other abnormalities. Likewise, interventional imaging, such as needle tracking, catheter tracking, and the like, requires 3D information. Also, depth information is useful in the so-called interactive imaging techniques in which images are displayed in real or near-real time and in response to which the operator can adjust scanning parameters, such as view angle, contrast parameters, field of view, position, flip angle, repetition time, and resolution.

Three-dimensional imaging generally involves either acquiring multiple two-dimensional or slice images which are combined to produce a volumetric image or, alternately, the use of three-dimensional imaging techniques. Much effort at improving the efficiency of volume imaging has been focused on speeding up the acquisition. For example, many two-dimensional fast scan procedures have been adapted to three-dimensional imaging. Likewise, efforts have been made to improve reconstruction speed and efficiency, for example, through the use of improved reconstruction algorithms. Nevertheless, three-dimensional imaging remains relatively slow.

Echo planar imaging (EPI) is a known imaging technique in which a series of echoes is rapidly induced following a single RF pulse. More specifically, an RF pulse and a slice select gradient are applied to excite resonance in a selected slice and a phase encode gradient is applied to phase encode the resonance. A series of frequency encode or read gradients of alternating polarity is applied in successive fashion. During each read gradient, a magnetic resonance signal or echo is read out. Between each read gradient, a short pulse or blip along the phase encode gradient axis is applied to increment the phase encoding of the resonance by a line in the selected slice. A one-dimensional inverse Fourier transform of each echo provides a projection of the spin distribution along the read axis. A second inverse Fourier transform along the phase encoded echoes provides a second dimension of spatial encoding. Typically, the phase encode gradient blips are selected of an appropriate magnitude that data for a complete field of view is taken following each RF pulse. The total sampling time is determined by the number of sampled points per read gradient and the number of phase encode gradient steps.

Echo volume imaging extends echo planar imaging techniques to multiple planes. After performing the above-described echo planar imaging sequence, a pulse or blip along a secondary phase encoding axis is applied. Typically, the secondary phase encoding blips step the phase encoding along an axis perpendicular to the primary phase encode and read axes. Thereafter, phase encode gradient blips are applied between each read gradient to step line by line in the primary phase encode direction. Because the phase encode blips in the first k-space plane move the phase encoding to one extreme edge of the field of view, the phase encoding blips in the second k-space plane in the secondary phase encode direction are typically of the opposite polarity to step the phase encoding back in the opposite direction. In this manner, the multiple planes are aligned, but offset in steps in the z-direction. One disadvantage of the above echo planar imaging and echo volume imaging techniques is that the trajectory through k-space is reversed in time for alternate phase encode lines or views. This causes phase discontinuities which can result in ghosting.

Spiral echo planar imaging techniques are also known, in which the applied x- and y-gradient pulses, i.e., along the traditional read and phase encode axes, are sinusoidally varying and linearly increasing. In this manner, data sampling commences at the center of the field of view and spirals outward, covering the field of view along a spiral k-space trajectory. One of the drawbacks of spiral echo planar imaging, however, is that it is a single slice technique. To obtain multiple slices, the spiral echo planar imaging technique is repeated multiple times. An RF excitation pulse and slice select gradient followed by sinusoidally varying and linearly increasing x and y-gradients are applied for each slice to achieve coverage of the volume of interest.

Accordingly, the present invention contemplates a new and improved magnetic resonance imaging apparatus and method wherein three-dimensional or depth information is acquired following a single RF excitation pulse.

SUMMARY OF THE INVENTION

In accordance with the present invention, a magnetic resonance imaging technique is provided in which data is collected in a selected number of planes or partial planes of k-space.

In accordance with one aspect, a method of diagnostic imaging comprises establishing a polarizing magnetic field in an examination region and applying a radio frequency pulse to excite magnetic resonance in a volume of interest as a whole. After exciting magnetic resonance in the whole volume, the excited magnetic resonance is simultaneously sampled and spatially encoded in the absence of radio frequency pulses to collect data for a plurality of intersecting planes or partial planes of k-space data. Each plane of k-space data corresponds to a different view through the volume of interest. The plurality of planes or partial planes of k-space data are collected without collecting a complete three-dimensional k-space data set.

In accordance with a further aspect, a magnetic resonance imaging apparatus includes a magnet system for creating a temporally constant magnetic field through an examination region in which at least a portion of an object to be imaged is placed and a radio frequency excitation system for applying radio frequency excitation to a volume of interest of the object to be imaged. A receiver system detects and demodulates magnetic resonance data from the volume of interest and a magnetic field encoding system applies encoding magnetic fields to provide spatial discrimination of magnetic resonance data from the volume of interest within a single radio frequency excitation period. The magnetic field encoding system spatially encodes the magnetic resonance signal data along a preselected k-space trajectory, the k-space trajectory covering a plurality of intersecting planes or partial planes of k-space data.

One advantage of the present technique is that it provides the speed characteristics of echo planar imaging while providing a plurality of views which can be used for depth perception purposes.

Another advantage of the present invention is that three dimensions can be spatially encoded in a single shot, with no noticeable delay between the different views, thus eliminating inconsistencies, blurring, or other artifacts due to many types of motion, such as patient motion, physiological motion, and so forth.

Another advantage is that the present invention can be readily adapted to applications using a short data collection window, such as freezing the motion of rapidly moving structures, following a bolus injection of contrast media, and so forth.

Another advantage is that the present technique can be readily adapted to interventional methods, such as needle or catheter tracking.

Still another advantage is that the present invention can be used to provide rapid depth cues for interactive imaging applications.

Another advantage is that sampling is more efficient because the full volume of k-space data is not collected.

Another advantage of the present invention is that it decreases patient examination time.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

FIGS. 7A and 7B illustrate an alternate paddle wheel-shaped k-space trajectory.

DETAILED DESCRIPTION OF THE PREFERRED EMBODIMENTS

Figure 1:
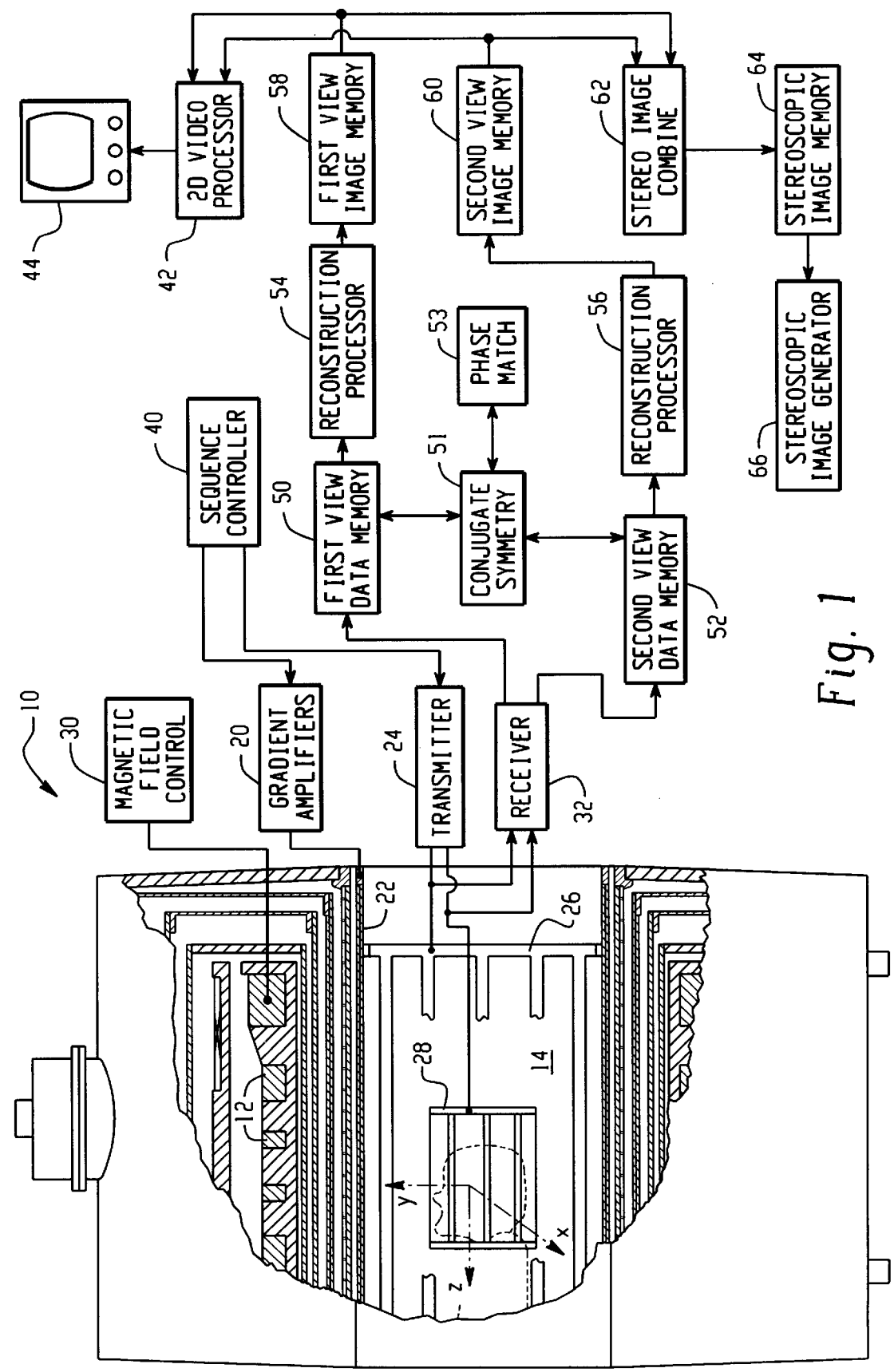
FIG. 1 is a diagrammatic illustration of a magnetic resonance scanner in accordance with the present invention.

With reference to FIG. 1, an MRI scanner 10 includes a main magnetic field control 30 that controls superconducting or resistive magnets 12 such that a substantially uniform, temporally constant main magnetic field $B_0$ is created along a z-axis through an examination region 14. Although a bore-type magnet is illustrated in FIG. 1, the present invention is equally applicable to open magnet systems and other known types of MRI scanners. An imaging experiment is conducted by executing a magnetic resonance sequence with the subject being imaged or examined (e.g., patient, phantom, or otherwise) placed at least partially within the examination region 14, typically with the region of interest at the isocenter. The magnetic resonance sequence in accordance with the present invention entails application of an RF magnetic field pulse ($B_1$) to induce magnetic resonance in a volume of interest and application of magnetic field gradient pulses or cyclic waveforms that are applied to the subject to spatially encode the magnetic resonance. More specifically, gradient pulse amplifiers 20 apply current pulses to whole body gradient coil assembly 22, to create magnetic field gradients along x-, y-, and z-axes of the examination region 14.

An RF transmitter 24, preferably a digital transmitter, applies an RF pulse to an RF transmission coil, such as whole-body RF coil 26, to generate an RF magnetic field pulse in the examination region. A typical RF pulse is composed of a packet of immediately contiguous pulse segments of short duration which taken together with each other and any applied gradients achieve a selected magnetic resonance manipulation.

The RF pulses are used to excite resonance in selected portions of the examination region. For whole-body applications, the resulting resonance signals, generated as a result of a selected manipulation, are also commonly picked up by the whole-body RF coil 26. Alternately, for generating RF pulses in limited regions of the subject, local RF coils are commonly placed in proximity to the selected region. For example, as is known in the art, an insertable head coil 28 is inserted surrounding a selected brain region at the isocenter of the bore. Other surface coils or other such specialized RF coils may also be employed. Preferably, the whole-body RF coil 26 induces resonance and the local RF coil receives magnetic resonance signals emanating from the selected region. In other embodiments, the local RF coil excites and receives the resulting magnetic resonance signals.

Regardless of the RF coil configuration, the resultant RF magnetic resonance signals are picked up by one or another of the RF coils employed and demodulated by a receiver 32. Preferably, a sequence control circuit 40 controls the gradient pulse amplifiers 20 and the RF transmitter 24 to produce an MRI pulse sequence that generates magnetic resonance (MR) signals or echoes received and sampled by the receiver 32.

After application of the RF pulse to excite resonance in a selected volume of interest, an MRI gradient pulse sequence is executed by gradient amplifiers 20 under the control of sequence control circuit 40 to simultaneously spatially encode and sample the excited magnetic resonance in the absence of further radio frequency pulses to collect data for a plurality of intersecting planes or partial planes of k-space data within the excited volume. The multiple planes of data are collected without collecting k-space data for the entire volume of k-space. An optional conjugate symmetry processor 51 generates a full plane of k-space data when a half plane of data is collected. Phase match processor 53 corrects for any phase discontinuity between the sampled data and the synthesized conjugately symmetric data, for example, using a small amount of sampled data extending beyond the collected half plane, either by overscanning or by approximating such data for alignment purposes with actually collected data that is spatially close in k-space.

Data from the receiver 32 is sampled along a k-space trajectory covering a selected plurality of planes or partial planes of data. Data from a first plane or partial plane is stored in a first data view memory 50 and data from a second plane or partial plane is stored in a second data view memory 52. In the preferred embodiment illustrated, the number of planes or partial planes of data collected within the excited volume of interest is two. In alternative embodiments, a greater number of planes or partial planes may be imaged, preferably from about 3 to about 8.

In preferred embodiments, the MRI scanner performs echo planar imaging (EPI) pulse sequences modified to collect data from multiple planes or partial planes within the three-dimensional k-space volume. Data is sampled into a raw data time representation, then into a k-space representation accordingly, in the usual manner. In this manner, the present invention records an entire image, including depth information, in a single TR period, where TR represents the repeat time for the EPI sequence. It will be recognized that other multi-echo imaging techniques may also be adapted to perform the present invention, including but not limited to, fast spin echo, GRASE, HASTE, Express, multi-shot methods, spin echo EPI, gradient echo EPI, DWI-EPI, PWI-EPI methods, images of multiple echo times, and so forth.

In the preferred embodiments, each plane of data is reconstructed separately for output or display in a manner that conveys the depth information. A first reconstruction processor 54 reconstructs the received first view data into a first view image representation which is stored in a computer memory 58. Likewise, a second reconstruction processor 56 reconstructs the received second view data into a second view image representation which is stored in a computer memory 60. Alternately, a single reconstruction processor can reconstruct each view on a time shared basis. Reconstruction of the views is performed using standard reconstruction algorithms. In the preferred embodiment, resonance is excited in the full imaged volume of the subject. The first image representation is a projection of the full volume in a direction perpendicular to the first sampling plane and the second image representation is a projection of the same volume in a direction perpendicular to the second sampling plane. The two views are combined in stereo image combine processor 62 to form a stereographic or three-dimensional image representation stored in a memory 64.

Preferably, a stereoscopic image or 3D image is displayed or output via a 3D or stereoscopic image generator 66. That is to say, the image is rendered in a manner that provides depth information or depth cues to a viewer. Such techniques include displaying the images side by side on a display or on multiple displays for stereoscopic viewing, e.g., arranged for viewing with stereoscopic goggles, such as anaglyphic spectacles or the like. Also, a stereoscopic display of a type having a left-eye display and a right-eye display, e.g., mounted on a head-worn harness, may be employed. Also, a series of temporally displaced stereo views acquired can be displayed in succession, e.g., using a cine-type stereoscopic display. Also contemplated are the use a multilayer display of a type for viewing three-dimensional data sets, a holographic display for three-dimensional viewing of the multiple planes, such as an angularly multiplexed holographic display, and the use of a lenticular display wherein the multiple planes of data are displayed as multiple phases thereon. Additionally, or alternatively, the image planes may be output to a hard copy, such as stereoscopic print, e.g., of a type for viewing with stereoscopic goggles or glasses or wherein separate angularly displaced views are presented to each eye of a viewer. A hologram printer or other holographic recording means can be used to output the multiple views to a holographic recording medium, e.g., in the form of an angularly multiplexed hologram. Likewise, the views may be output as the multiple phases of multiphase lenticular print media. Of course, processing the image data for conventional two-dimensional display by video processor 42 for display on a conventional two-dimensional display monitor 44 is also contemplated, e.g., for display of the individual views, combinations or projections of the multiple views, hard copy printouts, and so forth, in standard fashion.

Figure 2A:
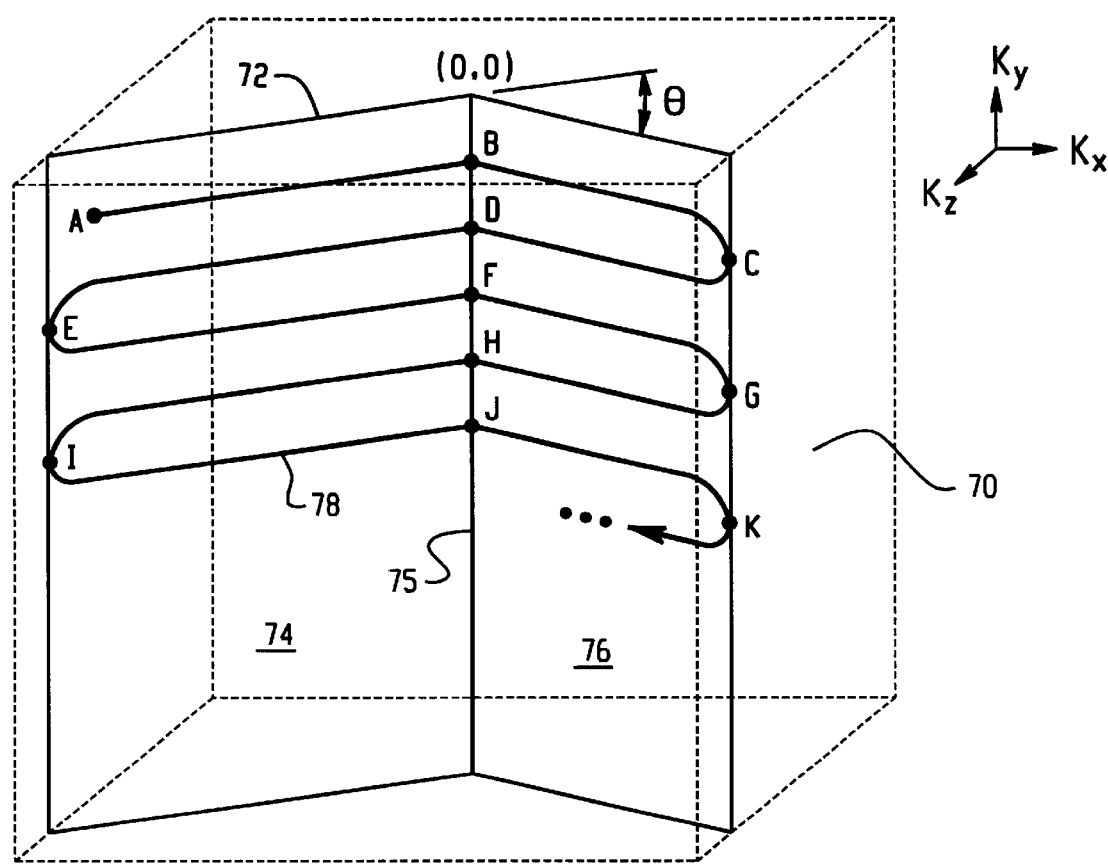
FIG. 2A is a diagrammatic illustration of a dihedral k-space trajectory.

With reference to FIG. 2A, magnetic resonance is excited in a volume of interest and the sequence controller 40 controls the x, y, and z-gradient coil drivers and amplifiers 20 in such a manner that the sampling trajectory through k-space 70 covers the surface of a dihedron 72. The dihedron 72 has a generally V-shaped cross section and is formed by two intersecting partial planes 74 and 76 within the k-space 70. The intersection between the planes 74 and 76 forms a fold line 75 along the $k_y$ direction. Preferably, each plane or partial plane of data collected passes through the center of k-space, in which case the line of intersection will also necessarily pass through the center of k-space. A k-space trajectory 78 proceeds successively through points A, B, C, etc., as illustrated, being stepped in the $k_y$ direction. The angle θ preferably ranges from about 4° to about 90°, and more preferably is an angle which provides a degree of parallax allowing the two images to be viewed three-dimensionally as a stereo pair, e.g., about 5°–150, most preferably about 6°. In addition to providing ideal separations for stereo viewing, the smaller angles correspond to gradient waveforms that are less demanding for the hardware to perform and are more efficient in that less time is spent jumping from plane to plane or changing direction when the trajectory passes over a fold.

Figure 2B:
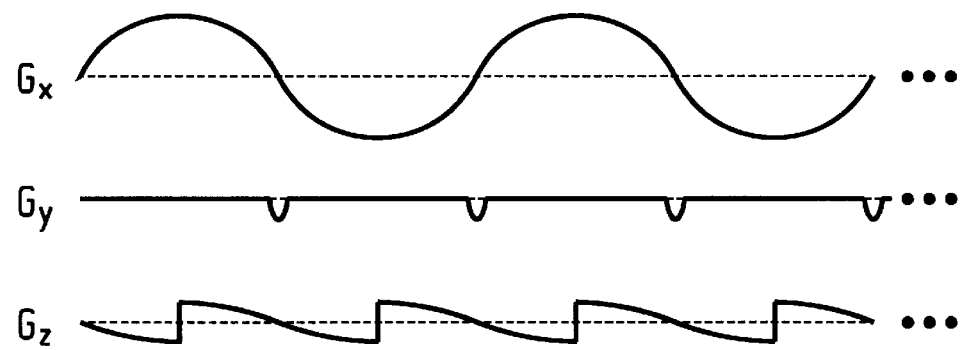
FIG. 2B is a partial pulse diagram illustrating the gradient pulse sequence for achieving a trajectory along the dihedral surface.

A partial pulse sequence for traversing k-space along the trajectory 78 shown in FIG. 2A is illustrated in FIG. 2B. Gradient $G_x$ is sinusoidally varying and gradient $G_y$ is a series of blips to step the trajectory along the axis $k_y$. A gradient $G_z$ having alternating sharp rise times and relatively slow fall times, e.g., a generally sawtooth waveform, is applied to cause the trajectory 78 to bend around the fold line 75.

With reference to FIG. 2B, the gradient waveform applied to $G_z$ can be thought of as a perturbation, altering the direction of the readout trajectory which would have otherwise been defined by $G_x$ without $G_z$. If the waveform $G_z$ were simply a constant zero amplitude, a conventional echo planar readout would be obtained, collecting a single plane of k-space. However, in the embodiment of FIGS. 2A and 2B, on one side of the fold 75, the conventional direction $k_x$ is replaced by an angled direction with both positive $k_x$ and $k_z$ components. On the other side of the fold 75, the conventional direction $k_x$ is replaced by another angled direction, with positive $k_x$ but with negative $k_z$ components. The waveform $G_z$ provides the perturbation or deviation which causes k-space trajectories to deviate from the single flat plane of $k_z=0$. Considered this way, it becomes evident that when trajectories are required to change directions abruptly as they cross the fold, it is natural that the perturbation part of $G_z$ should exhibit a sharp change, as is seen in points B, D, F, etc.

The pulse diagrams shown and described herein show a few cycles of the readout portion of the pulse sequence for the purpose of illustrating exemplary data collection techniques representative of the present invention. It will be recognized that, prior to the readout, an RF excitation is performed. The present invention is not limited to any particular excitation or RF characteristics. For example, the RF excitation can be spin echo, field echo, multiple echo formation, or stimulated echoes. The volume excited may be a slab, a column, a volume prescribed in three dimensions, or even spatially completely nonselective. Likewise, there can be prepulses of any sort, such as chemical (fat) saturation, spatial presaturation pulses, MTC pulses, inversion recovery, etc. After the initial excitation, there may be contrast preparation methods applied, including, for example, diffusion weighting, velocity flow encoding, spectroscopic editing, etc.

Figure 2C:
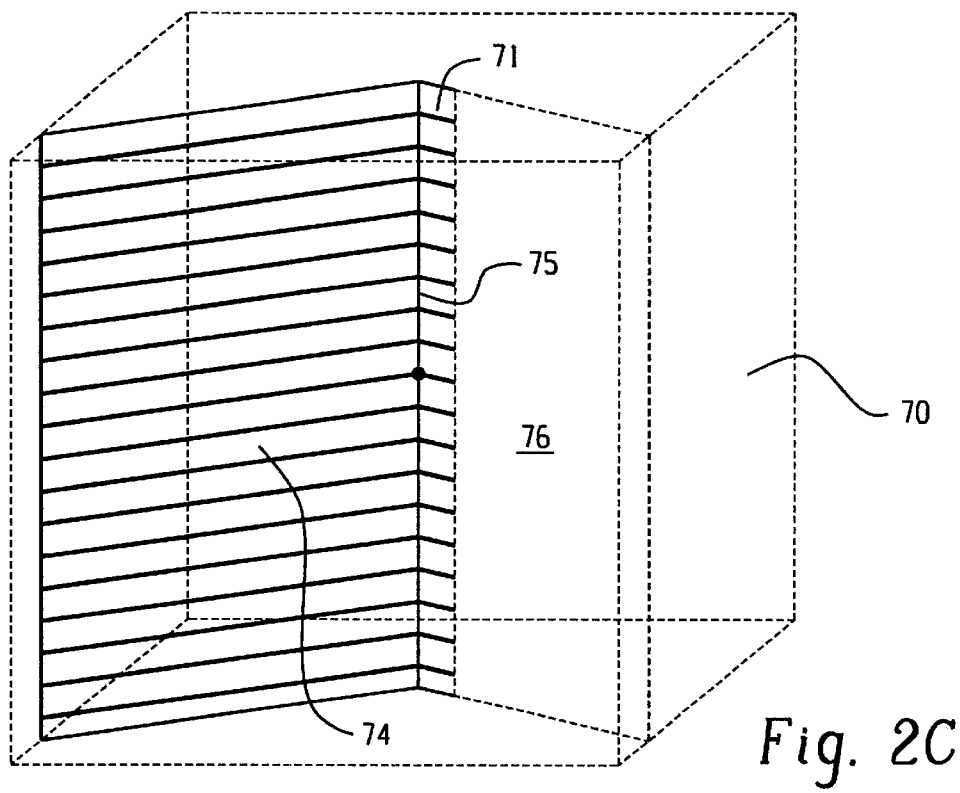
FIGS. 2C and 2D illustrate a preferred manner of reconstruction in which each plane of k-space is separately reconstructed using a small amount of data from across the intersection of the planes, in accordance with a preferred embodiment.
Figure 2D:
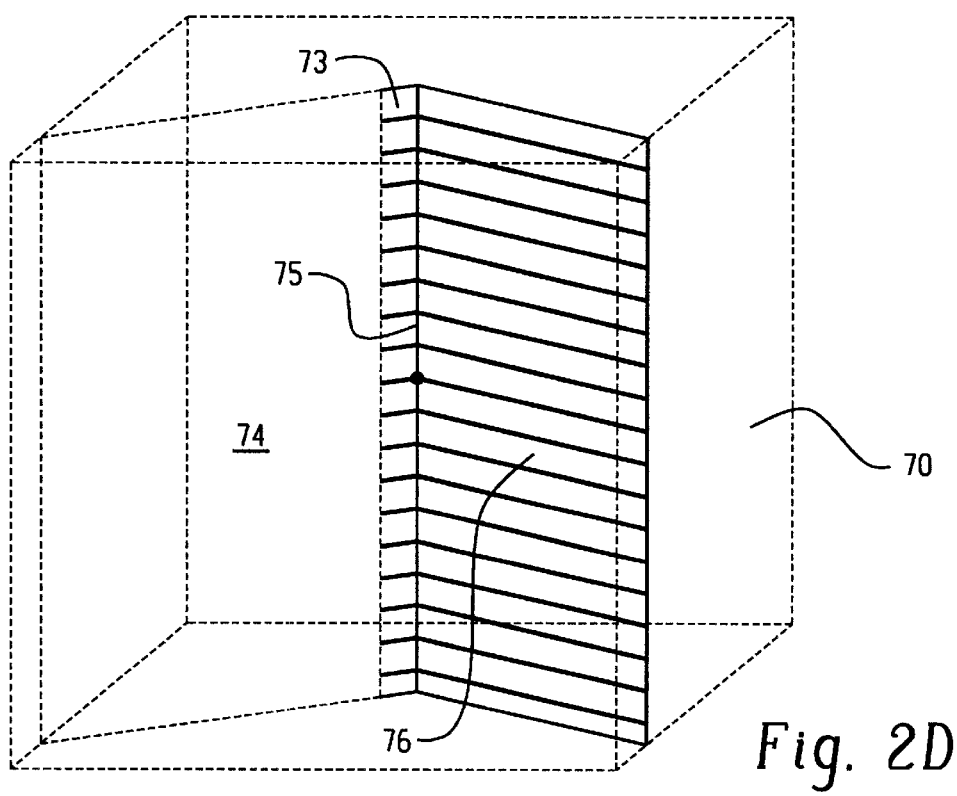

In the embodiment of FIG. 2A, and other embodiments where half-planes of k-space data are collected, conjugate symmetry is preferably used to generate the other half of the plane, thus generating a full data set for the view. Typically, when conjugate symmetry synthesis is to be performed, it is desirable to collect just over half of the data set. The redundant actually sampled data and conjugate data are compared to determine a phase correction for any phase discontinuity at the interface between the actually collected and conjugate data. In those embodiments wherein the k-space trajectory bends around the fold line, data extending just beyond the intersection of the planes is not collected. In such instances, the small amount of data from just beyond the fold is used to approximate uncollected data, as illustrated in FIGS. 2C and 2D. In FIG. 2C, a small amount of data 71 from plane 76, i.e., just across the fold 75 from the plane 74, is used as an approximation of data just beyond the fold, but along the direction of plane 74. Likewise, in FIG. 2D, a small amount of data 73 from plane 74, i.e., just across the fold 75 from the plane 76 is used as an approximation of data just beyond the fold, but along the direction of plane 76. The approximation holds due to the spatial proximity within k-space of the approximated region to the actual region, particularly where angle θ is some modest angle, e.g., suitable for stereoscopic viewing of the two views. Thus, it can be seen that a data set corresponding to two viewing directions through a volume can be acquired as quickly as a standard 2D planar scan.

Figure 3A:
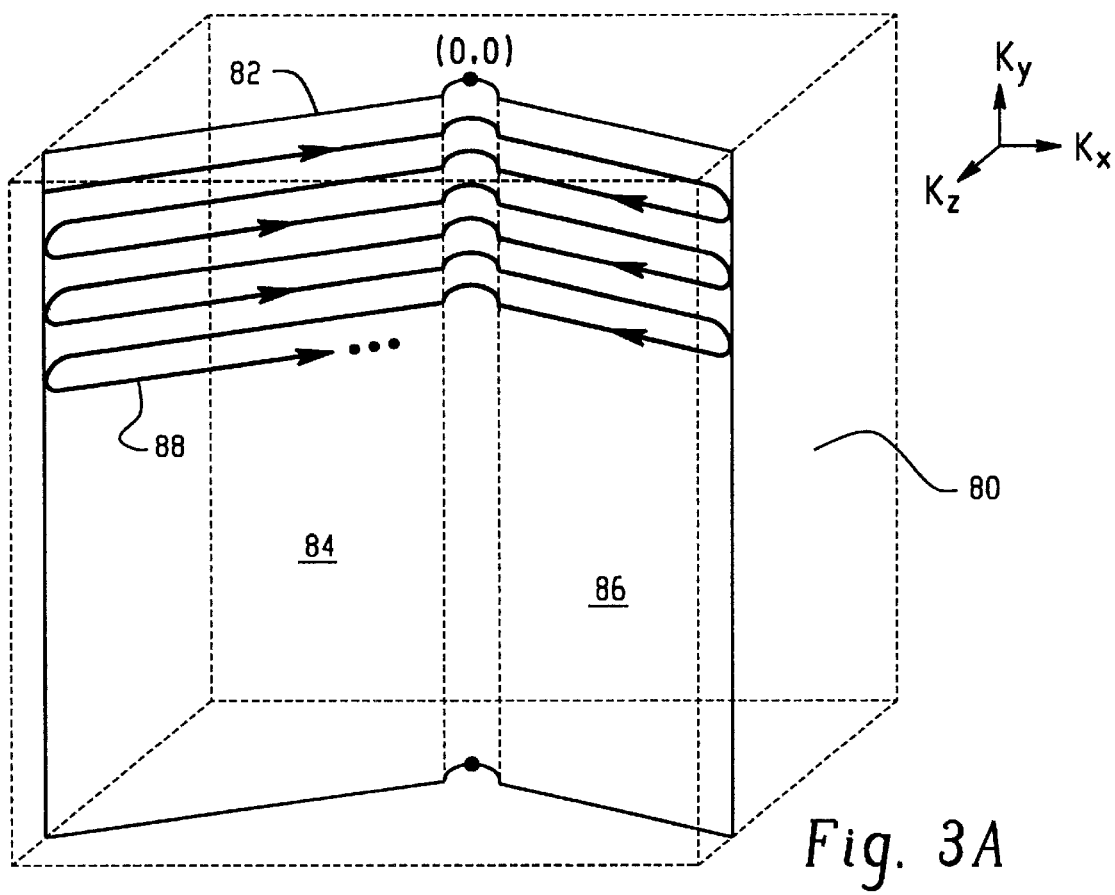
FIGS. 3A and 3B illustrate an alternate embodiment of the dihedral k-space trajectory similar to that shown in FIG. 2A, but wherein the near-instantaneous rise times of the $G_z$ gradient waveform are eliminated.
Figure 3B:
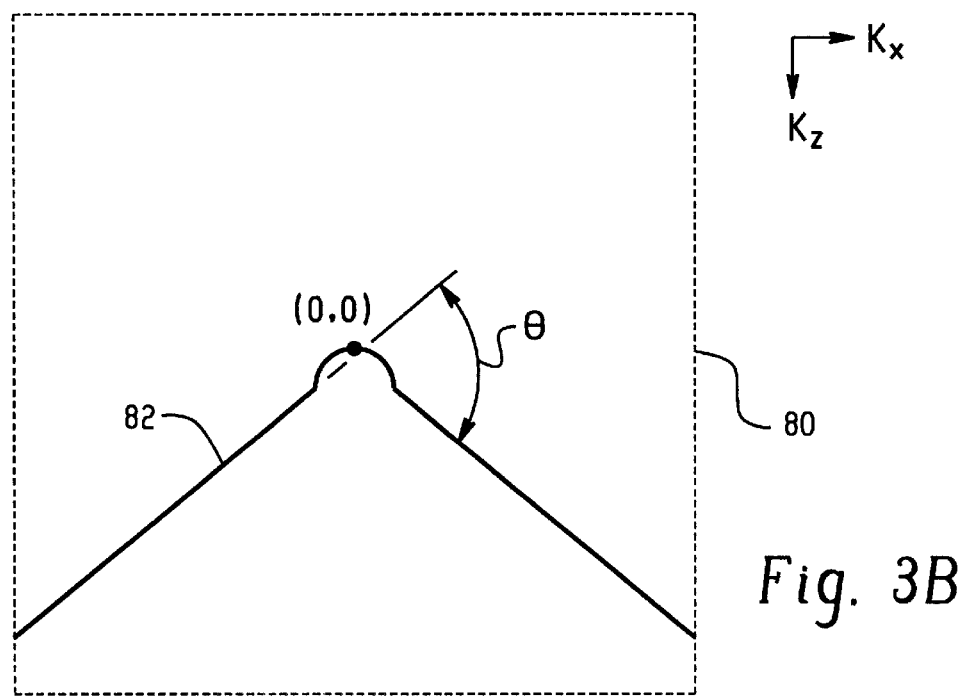
Figure 3C:
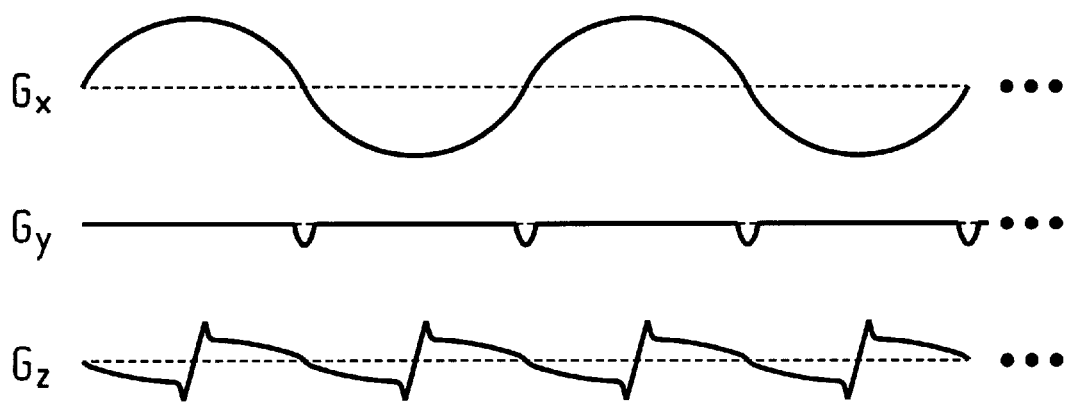
FIG. 3C illustrates a partial pulse diagram illustrating the gradient pulse sequence for achieving the trajectory shown in FIGS. 3A and 3B.

Other trajectories for covering the dihedral surface 72 are contemplated as well, and the present invention is not limited to coverage of the multiple planes or partial planes of k-space with any specific k-space trajectories. For example, a trajectory may be modified so that the gradient cycle is one that is more easily realized by the gradient hardware 20. For example, in the embodiment of FIG. 2A, the phase encode gradient $G_z$ has a vertical or near vertical slope where the trajectory turns a sharp corner at the center of k-space, i.e., at points B, D, F, and so on, along the line of intersection 75. In the embodiment of FIG. 3A, the trajectory veers out of the plane slightly near the center of k-space (0,0) and traverses a smooth curve to provide a generally dihedral surface 82 comprising partial planes 84 and 86 within k-space volume 80. FIG. 3B is a top view of k-space 80, illustrating the cotter pin-shaped cross section of the collected dihedral surface 82. A partial pulse sequence for traversing the surface 82 in k-space in a series of cotter-pin-shaped trajectories, stepped down along the $k_y$ axis in a manner analogous to FIG. 2A, is shown in FIG. 3C. In alternate embodiments, it is possible to instead bring the $G_x$ gradient down to a value of zero for an instant when crossing the fold, however, this technique is not preferred since it interrupts the large amplitude gradient, thus likely slowing down the acquisition.

Figure 3D:
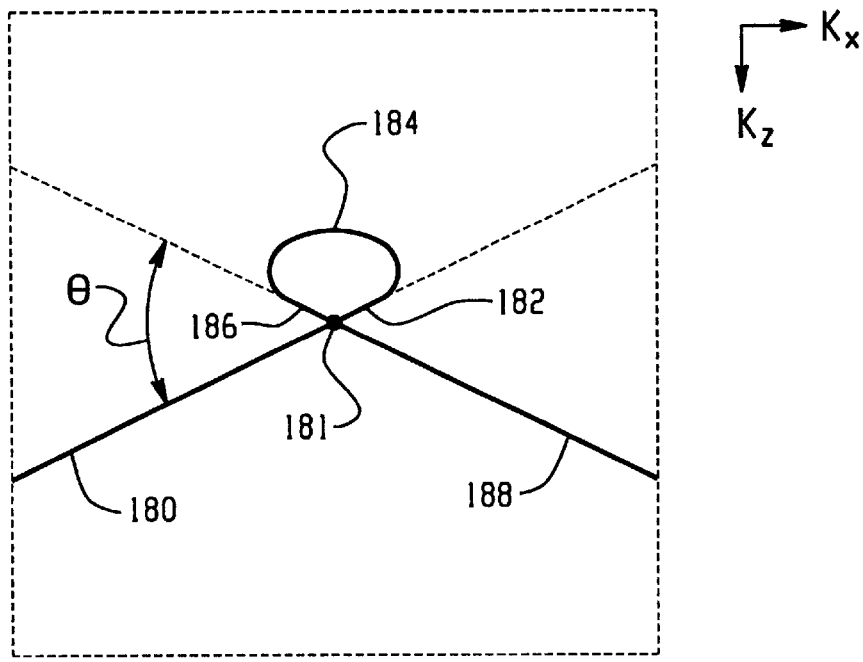
FIGS 3D and 3E illustrate alternate embodiment k-space trajectories with half-planes connected by smooth curves.
Figure 3E:
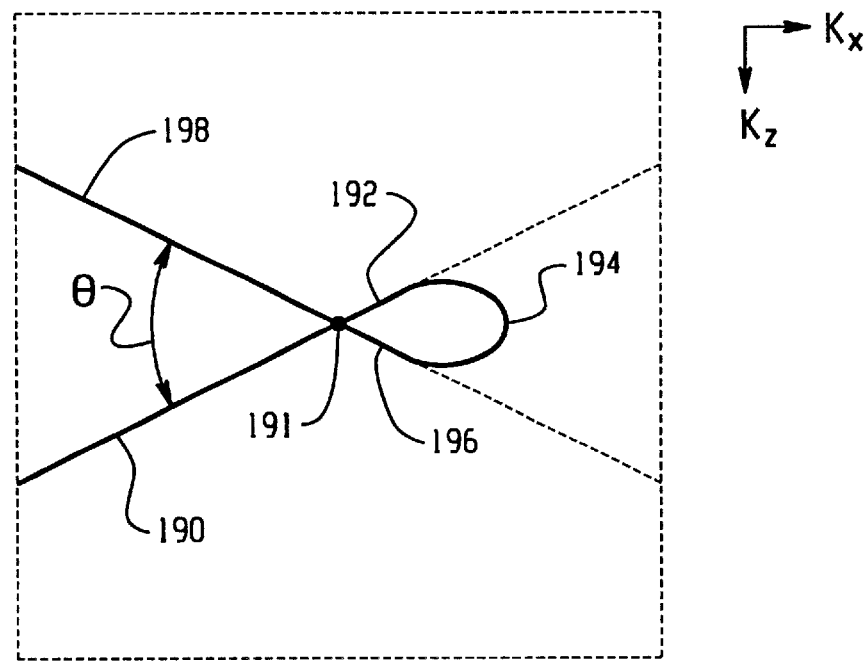

Additional alternate embodiments are illustrated in FIGS. 3D and 3E wherein a line of intersection between two half-planes of data is traversed in a smooth curve. In FIG. 3D, half-planes 180 and 188 differ from comprising a complete plane by an angle θ, preferably a small angle. The k-space trajectory in this case involves traversing a half-plane 180, and proceeding past a line of intersection 181, and along a path with substantially the same direction 182. The trajectory next is smoothly curved along a portion of a loop 184, towards the line of intersection along a section of trajectory 186, and then proceeding in substantially the same direction past the line of intersection, along the second half-plane 188.

The looped section sweeps out a change of direction through a net angle of substantially 360°−θ. The trajectory then reverses itself, and is repeated several times for various steps of $K_y$.

In FIG. 3E, half planes 190 and 198 nearly coincide with each other, being separated by an angle θ, preferably a small angle. In this case, a looped section 194 of the trajectory traces out in a smooth fashion a change of direction of substantially 180°+θ.

The trajectories illustrated in FIGS. 3D and 3E are advantageous in that they can be generated with smooth gradient profiles which are practical for implementation with typical gradient hardware amplifiers 20 and gradient coils 22. Further, both of these sample trajectories can be performed so as to collect data just past the center of k-space, e.g., from regions 182 and 186 (FIG. 3D) and 192 and 196 (FIG. 3E), data which can be used beneficially in the operation of conjugate symmetry synthesis.

In such implementations, it is natural that the line of interesection (181 and 191, respectively) be chosen to coincide substantially with the k-space location where $K_x=0$ and $K_z=0$. A further advantage is that the trajectories may be generated with steady waveforms, free of transients or significant errors as the critical data at the center of k-space is collected. These two trajectories have the minor disadvantage the looped portions (184 and 194 respectively) represent modest inefficiencies, in that any data that would be collected in these portions of the trajectories is simply discarded.

Figure 4A:
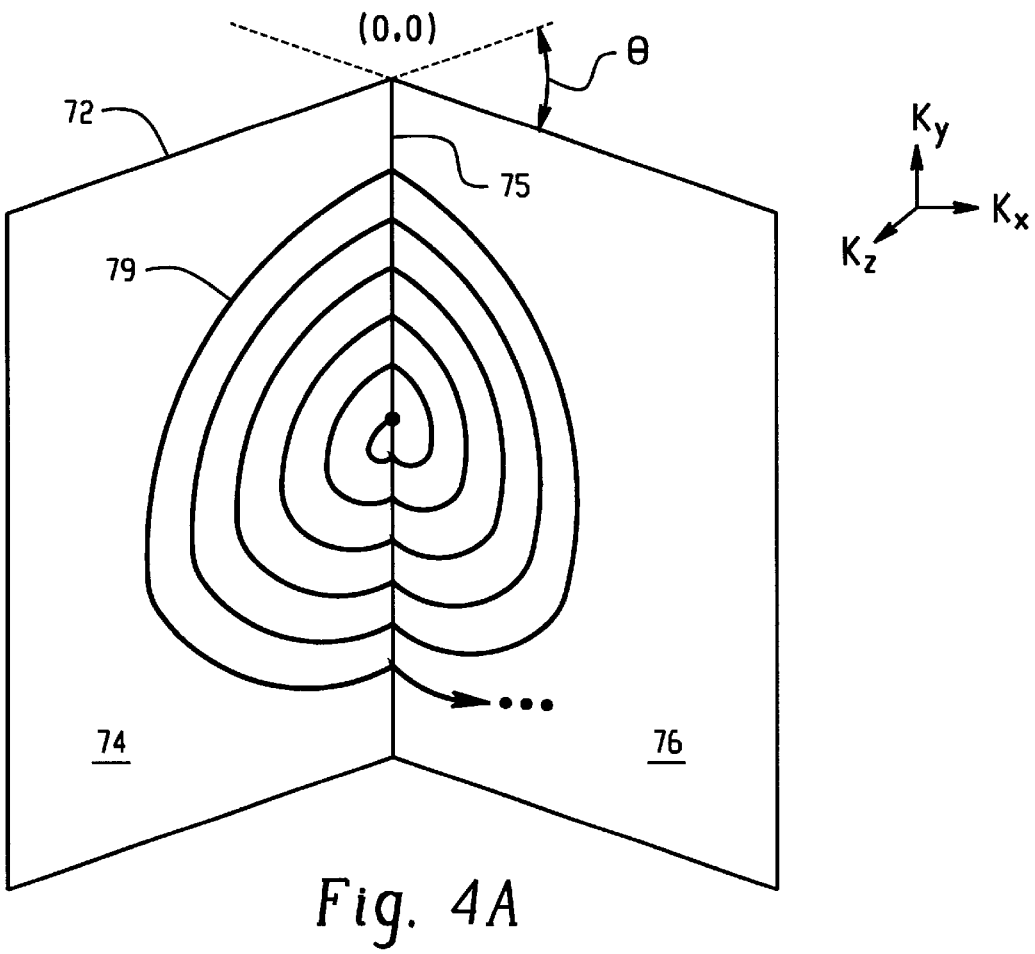
FIG. 4A illustrates a dihedral spiral k-space trajectory.
Figure 4B:
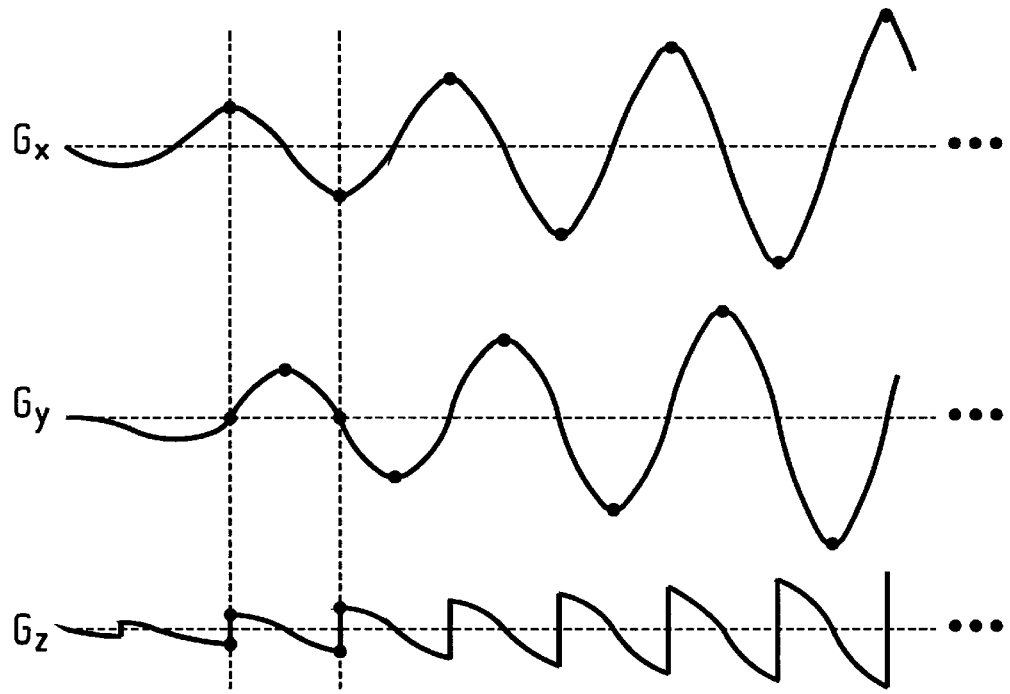
FIG. 4B illustrates a gradient pulse sequence for achieving the dihedral spiral trajectory of FIG. 4A.

Yet another trajectory for covering a dihedral surface is illustrated in FIGS. 4A and 4B. FIG. 4A shows a spiral trajectory 79 folded across the planes 74 and 76 of the dihedral surface 72. A partial pulse sequence for traversing k-space along the trajectory 79 shown in FIG. 4A is illustrated in FIG. 4B. Gradients $G_x$ and $G_y$ are sinusoidally varying and linearly increasing in amplitude. A linearly increasing gradient $G_z$ having alternating sharp rise times and relatively slow fall times, e.g., a generally sawtooth waveform, is applied to cause spiral trajectory 79 to bend around the fold line 75. Again, each half-plane is expanded to a full plane using conjugate symmetry prior to reconstruction. Preferably, data from just over the fold, though an approximation, is used to align sampled and conjugately symmetric data.

Figure 5C:
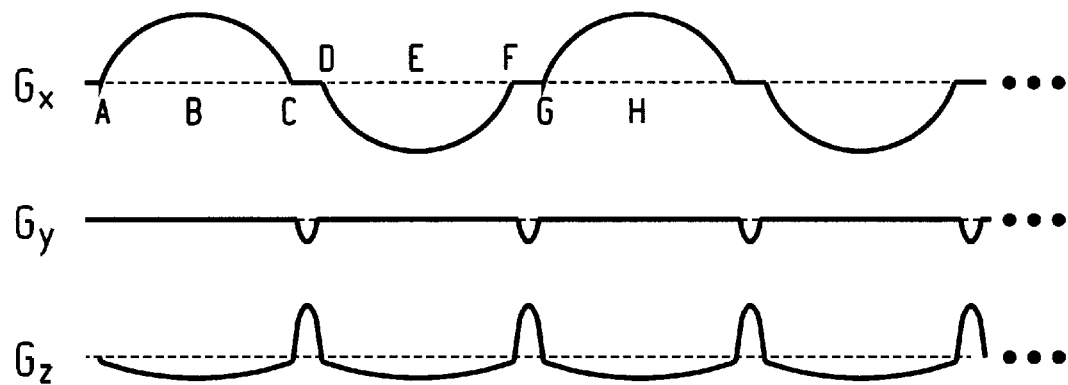
FIG. 5C illustrates a gradient pulse sequence for achieving the trajectory of FIGS. 5A and 5B.
Figure 5A:
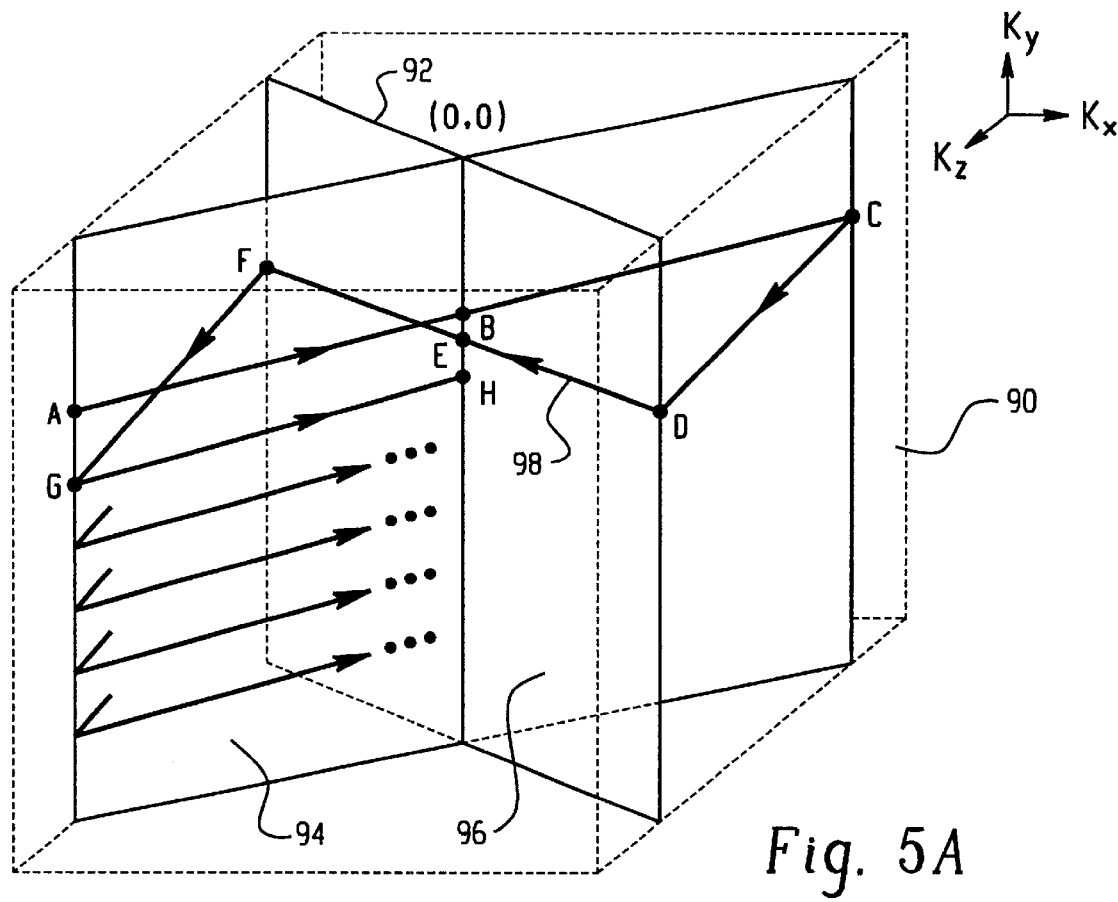
FIGS. 5A and 5B illustrate a generally paddle wheel-shaped surface imaged using a stepped bow tie-shaped k-space trajectory.
Figure 5B:
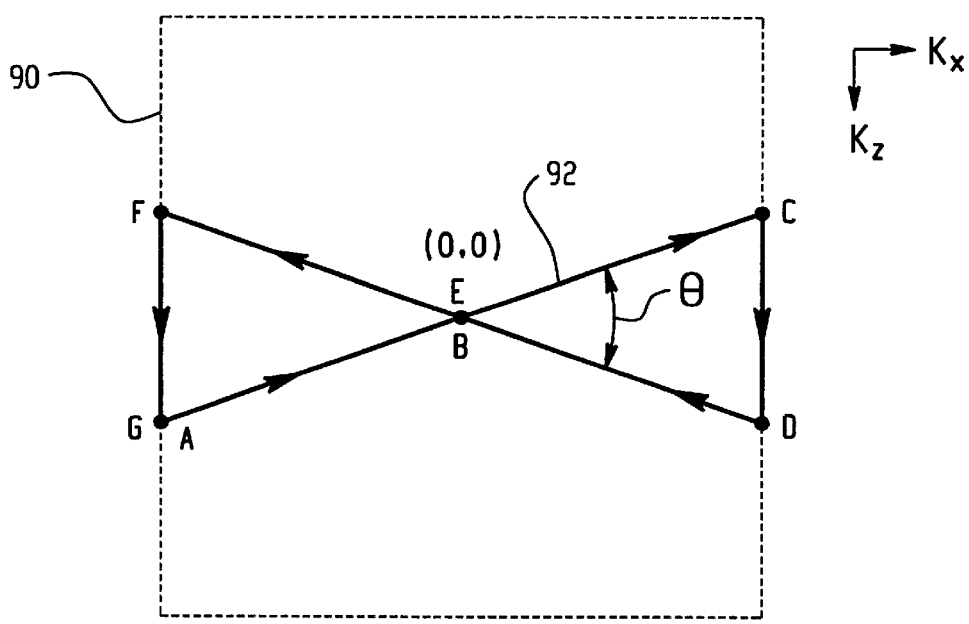

Referring now to FIG. 5A, magnetic resonance is excited in a volume of interest and the sequence controller 40 controls the RF transmitter 24, and x, y, and z-gradient coil drivers and amplifiers 20 in such a manner that the sampling trajectory through k-space covers a generally paddle wheel-shaped surface 92 within a k-space volume 90. The paddle wheel-shaped surface 92 has a generally bow tie-shaped cross section formed by the two intersecting planes 94 and 96 within the k-space volume 90. The k-space trajectory 98 proceeds as illustrated through points A-G, and continuing on in like manner while being stepped in the $k_y$ direction. The angle θ between the two planes 94 and 96 is as described above. A partial pulse sequence for traversing k-space along the stepped bow tie trajectory 98 is illustrated in FIG. 5B. During segments C-D, F-G, etc., data are not collected or are discarded, and the two planes, 94 and 96, of k-space are reconstructed to provide two views of the excited volume. Since full data planes are collected, conjugate symmetry is not needed. In the embodiment illustrated in FIG. 5C, the trajectory is stepped downward along the $k_y$ direction using a blip every half-cycle, i.e., stepped twice for each full bow tie trajectory traced. It is likewise possible to collect each full bow tie trajectory tracing at a single horizontal level, stepping along the $k_y$ axis only once every cycle, for example, by modifying the $G_y$ sequence shown in FIG. 5C by using phase encode blips having twice the size and half of the frequency.

The trajectory 98 is particularly advantageous in that each view is collected with the same polarity of readout, i.e., in the same direction, thus eliminating, in each view, N/2 artifacts associated with echo planar imaging.

Again, it is to be recognized that in FIGS. 5A and 5B, and elsewhere, the angular separation, θ, between the planes or half-planes may be drawn in an exaggerated fashion for ease in interpreting the drawing figures. As discussed previously, a relatively small angular separation is preferred.

Figure 6A:
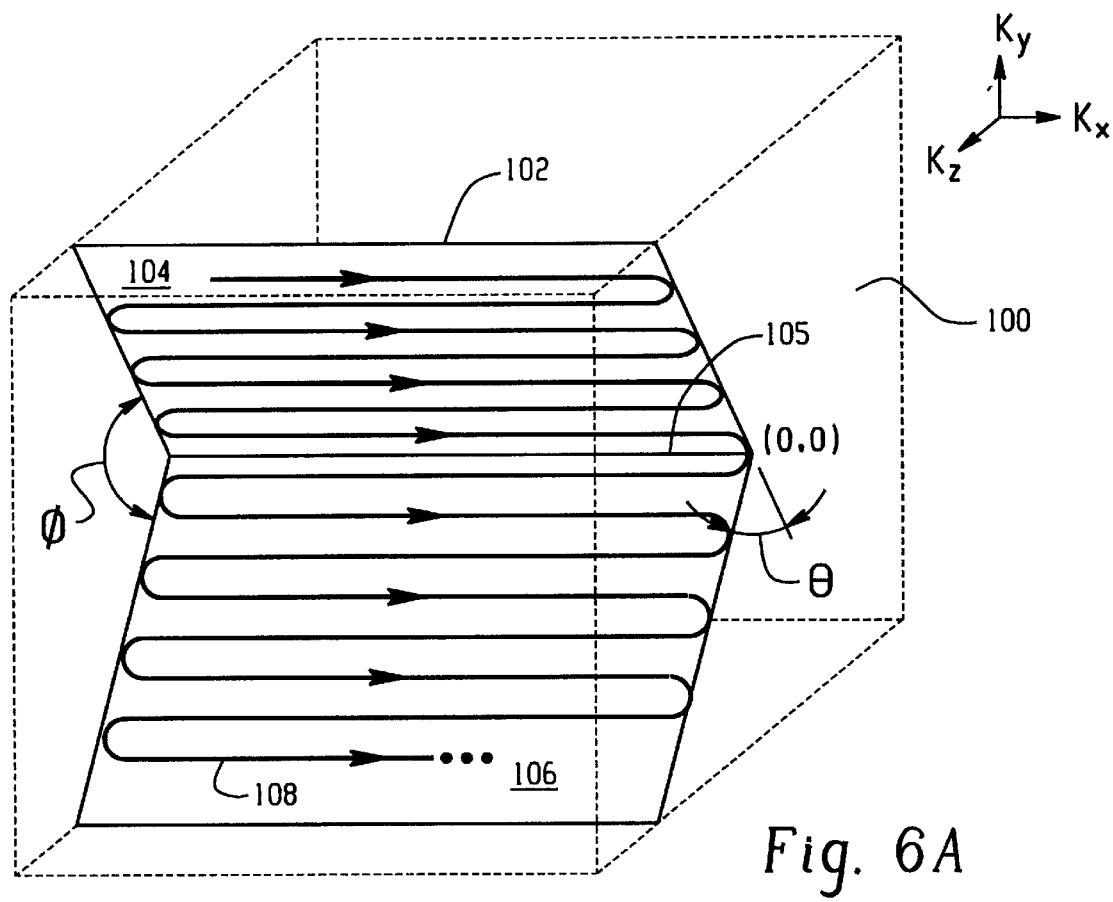
FIG. 6A illustrates an alternate dihedral k-space trajectory.
Figure 6B:
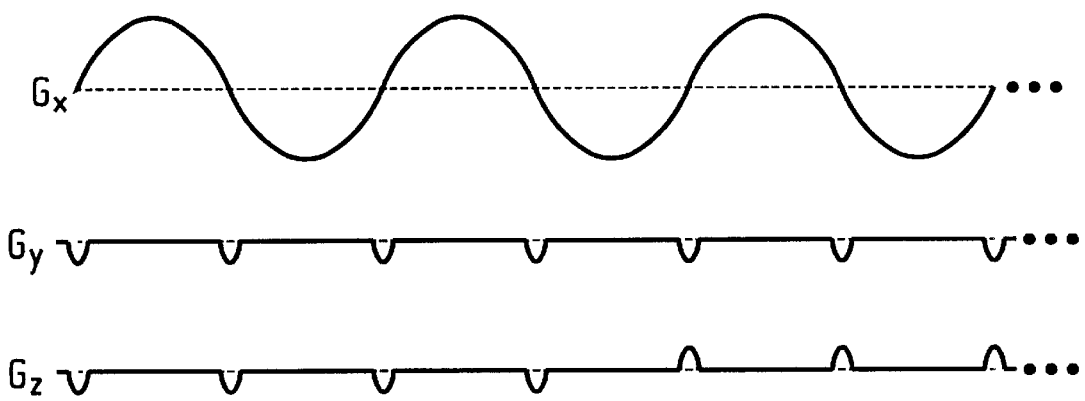
FIG. 6B illustrates a gradient pulse sequence for coverage of the dihedral surface of FIG. 6A.

With reference to FIG. 6A, magnetic resonance is excited in a volume of interest and the sequence controller 40 controls the RF transmitter 24, and x, y, and z-gradient coil drivers and amplifiers 20 in such a manner that the sampling trajectory through k-space volume 100 covers the surface of dihedron 102. The dihedron 102 has a generally V-shaped cross section and is formed by two intersecting partial planes 104 and 106 corresponding to two views of the volume of interest. The k-space trajectory 108 proceeds alternately back and forth in the $k_x$ direction, and stepping incrementally in the $k_y$ direction, as illustrated. The angle θ between the planes 104 and 106 is as described above. A partial pulse sequence for traversing k-space along the trajectory 108 is illustrated in FIG. 6B. Gradient $G_x$ is sinusoidally varying and gradient $G_y$ is a series of blips to step the trajectory along the axis $k_y$. Gradient $G_z$ comprises a series of blips to step the trajectory along the $k_z$ axis, with the polarity of the blips being reversed at the fold line 105, e.g., halfway through the echo train or when crossing the center of k-space. The embodiment of FIG. 6A is particularly advantageous in that gradient waveforms are easily realizable. This is because the intersection between the planes or fold line 105 lies in the direction of k-space data lines, i.e., the nominal k-space axis $k_x$ as illustrated. This eliminates the need to use a gradient waveform with very sharp rise times as in FIG. 2A wherein each line collected has to bend around the fold. The two half planes of data are reconstructed, again, using conjugate symmetry to generate the entire planes of data from the half planes. Again, the half planes can be extended a small amount for this purpose by approximating the uncollected extended regions with data from just over the fold line 105. Advantageously, the trajectory 108 may be performed with a symmetric RF spin echo formation near the center of k-space, so that the signal intensities in the upper half plane 104 closely resemble the signal intensities in the lower half plane 106.

Figure 7C:
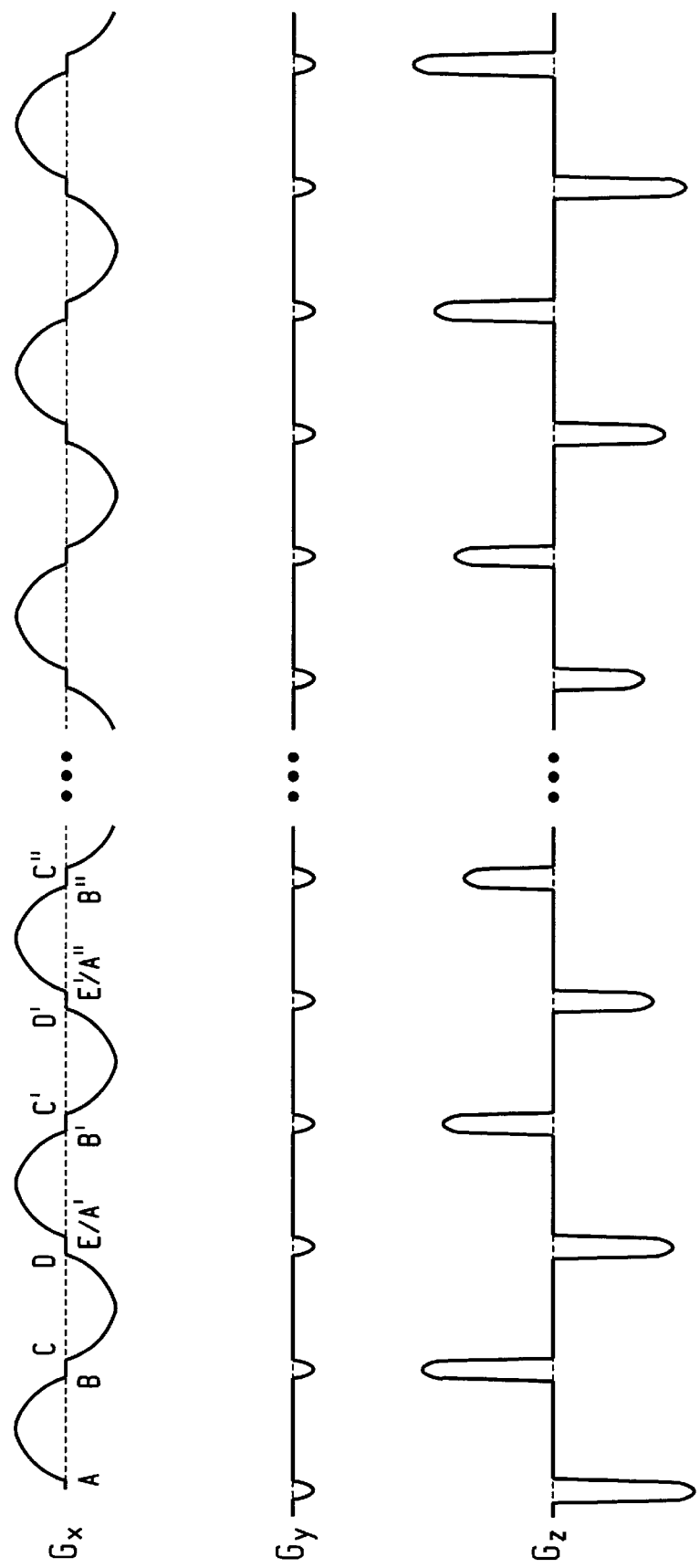
FIG. 7C illustrates a gradient pulse sequence for achieving the paddle wheel trajectory of FIGS. 7A and 7B.

With reference to FIG. 7A, magnetic resonance is excited in a volume of interest and the sequence controller 40 controls the RF transmitter 24, and x, y, and z-gradient coil drivers and amplifiers 20 in such a manner that the sampling trajectory 118 covers a paddle wheel-shaped surface 112 within a k-space volume 110. The paddle wheel-shaped surface 112 has a generally X-shaped cross section and is formed by two intersecting partial planes 114 and 116 within the volume of k-space 110. In this embodiment, the intersection between the planes or fold line 115 lies in the direction of the $k_x$ axis. The k-space trajectory 118 proceeds successively through points A, B, C, D, A', B', C', D', A", B", C", D", etc., wherein the trajectory is stepped along the $k_y$ axis at segments B-C, D-A', B'-C', D'-A", B"-C", D"-A'", and so on, wherein any data collected on these segments is discarded. Three successive top views of the trajectory 118, showing the narrowing along the $K_z$ direction as a function of time are shown in FIG. 7B. One of the angles θ and Φ, depending on whether the desired viewing angle is along the y or z axial direction, respectively, between the planes 114 and 116 is preferably some modest angle, preferably between 5° and 20°, so as to provide parallax for stereoscopic viewing. A partial pulse sequence for traversing k-space along the trajectory 118 is illustrated in FIG. 7C. Gradient $G_x$ is generally sinusoidally varying, with horizontal segments between each half-cycle, the horizontal segments decreasing in time as the trajectory approaches the intersection of the planes, e.g., the center of k-space and then increasing in time after the intersection of the planes is crossed, e.g., the second half of the echo train. Gradient $G_y$ is a series of blips to step the trajectory along the axis $k_y$. In the first half of the echo train, gradient $G_z$ comprises a series of blips of linearly decreasing amplitude and alternating polarity as the trajectory closes in on the center of k-space. After the center of k-space, i.e., the intersection of the planes 114 and 116, is reached, $G_z$ comprises a series of blips of linearly increasing amplitude and alternating polarity. The two planes of data are separately reconstructed. Since two full planes of data are collected, conjugate symmetry is not needed. Since each planar data subset extracted from the trajectory 118 is collected using a single consistent polarity of readout, N/2 ghosting is eliminated. Also, the two images have (to first order) the same effects due to motion, T2 or T2*decay, etc.

Figure 8A:
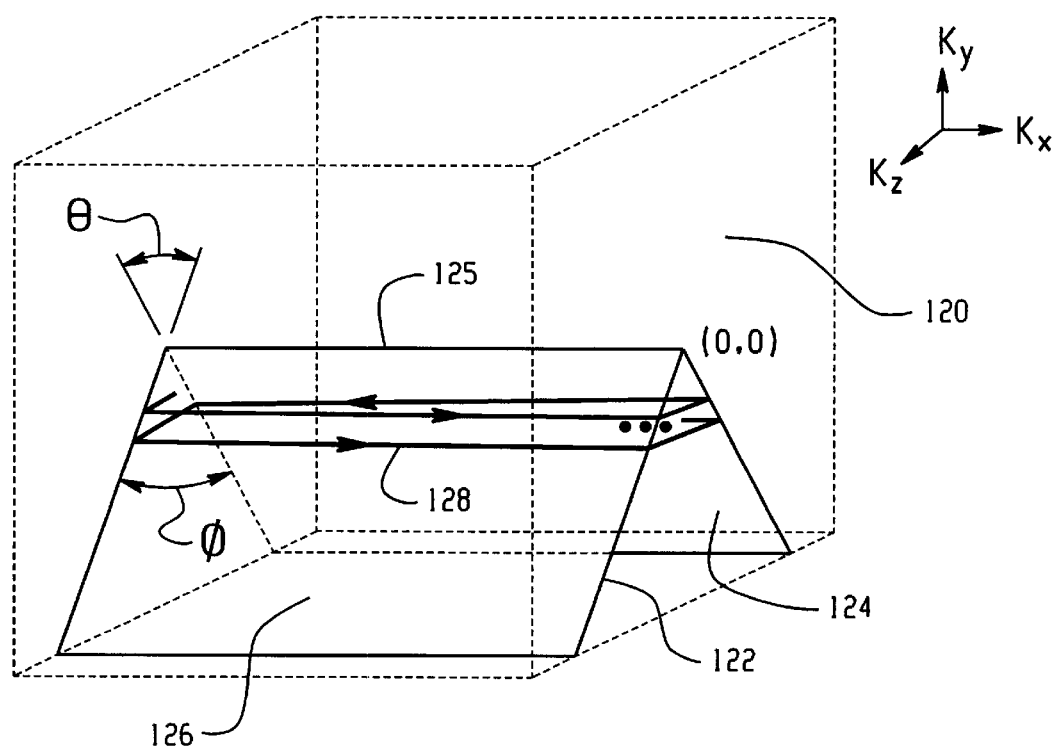
FIG. 8A illustrates yet another dihedral k-space trajectory.
Figure 8B:
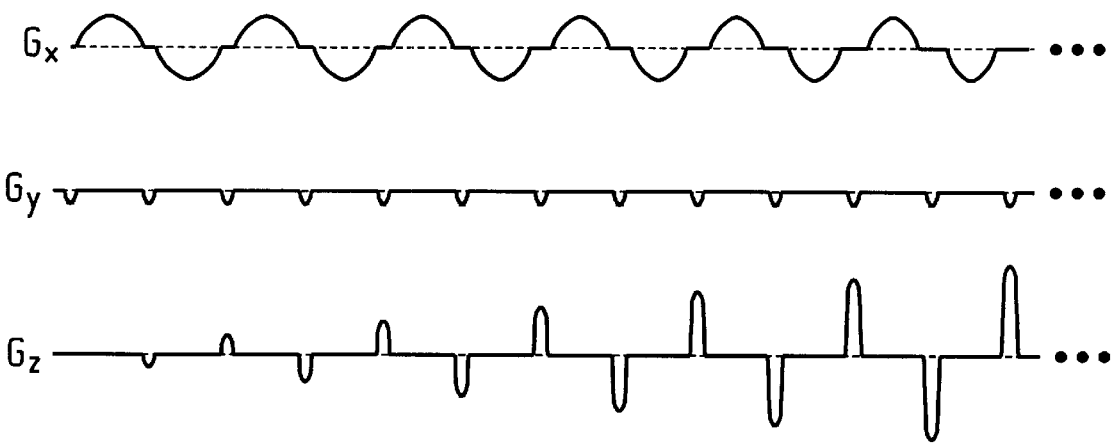
FIG. 8B illustrates a gradient pulse sequence for achieving the dihedral trajectory of FIG. 8A.

With reference to FIG. 8A, magnetic resonance is excited in a volume of interest and the sequence controller 40 controls the RF transmitter 24, and x, y, and z-gradient coil drivers and amplifiers 20 in such a manner that a sampling trajectory 128 covers a dihedral surface 122 within a volume of k-space 120. The dihedron 122 has a generally V-shaped cross section and is formed by two intersecting partial planes 124 and 126 within a k-space volume 120. In this embodiment, the intersection between the planes or fold line 125 lies in the direction of the $k_x$ axis. The k-space trajectory 128 proceeds in the same manner as trajectory 118 illustrated in FIGS. 7A and 7B, however, the trajectory 128 starts at the middle of k-space, i.e., along the fold line 125, and proceeds outward. Only data from the dihedral surface 122 is kept, i.e., that data collected as the trajectory 128 travels in the $k_x$ direction, with data corresponding to segments in which the trajectory jumps between the plane 124 and 126 are discarded. The angle θ between the planes 124 and 126 is preferably some modest angle, preferably between 5° and 20°, so as to provide parallax for stereoscopic viewing. A partial pulse sequence for traversing k-space along the trajectory 128 is illustrated in FIG. 8B. Gradient $G_x$ is generally sinusoidally varying, with horizontal segments between each half-cycle, the horizontal segments increasing in time as the trajectory moves away from the center of k-space. Gradient $G_y$ is a series of blips to step the trajectory along the axis $k_y$. Gradient $G_z$ comprises a series of blips of linearly increasing amplitude and alternating polarity as the trajectory moves away from the center of k-space.

Figure 9A:
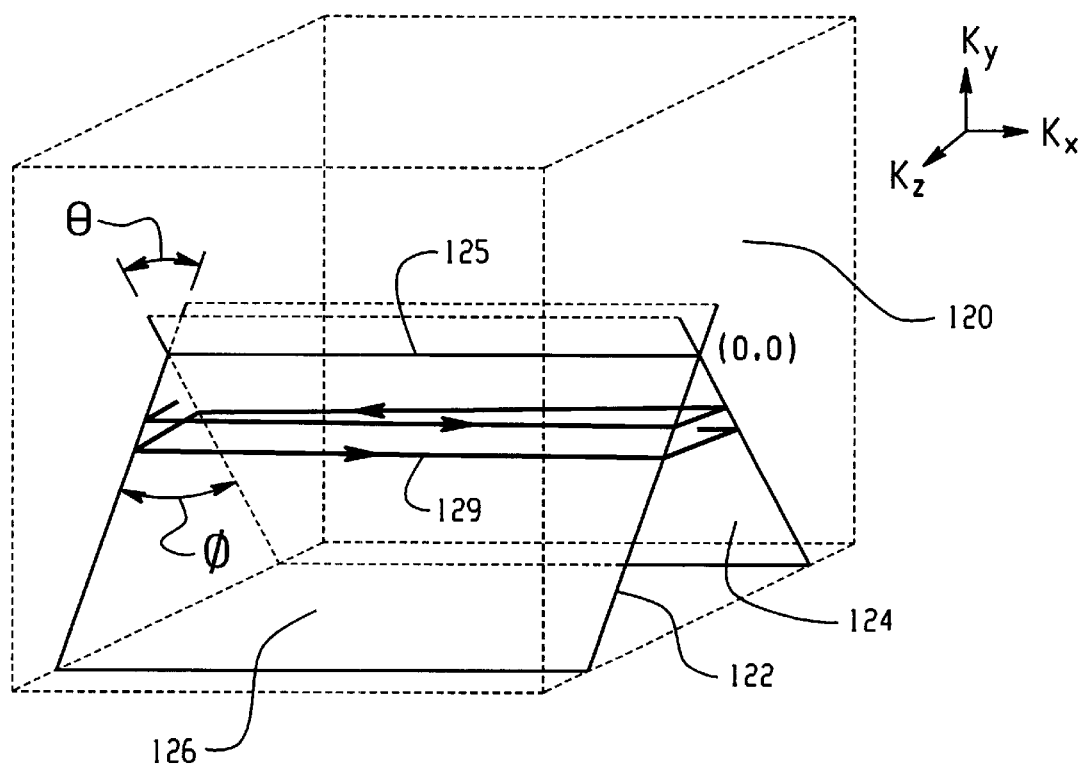
FIG. 9A illustrates an embodiment similar to FIG. 8A, but with overscanning.
Figure 9B:
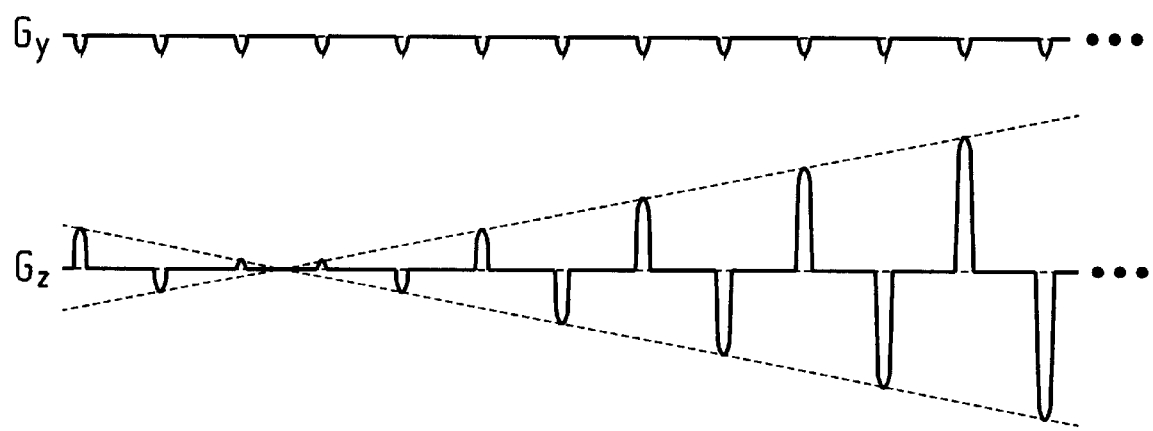
FIG. 9B illustrates a gradient pulse sequence for achieving the trajectory of FIG. 9A.

The embodiment of FIG. 8A is similar to that of FIG. 7A, but wherein half planes of data are collected. Since half planes are collected, conjugate symmetry is used to generate a full data set for the view. Again, a small amount of data from just across the fold may be used to approximate uncollected data along the plane for the purpose of aligning the conjugately symmetric data and the actually collected data. However, more preferably, the data from just across the fold is collected by using a small amount of overscanning as shown in FIG. 9A, which illustrates an embodiment similar to that of FIG. 8A, but with a small amount of overscanning. A partial pulse sequence for the trajectory of FIG. 9A is shown in FIG. 9B. The embodiments of FIGS. 8A and 9A are particularly advantageous where a short time to echo (TE) is desired, e.g., for contrast reasons, to reduce sensitivity to motion, to reduce susceptibility-induced signal loss, and so forth.

Figure 10A:
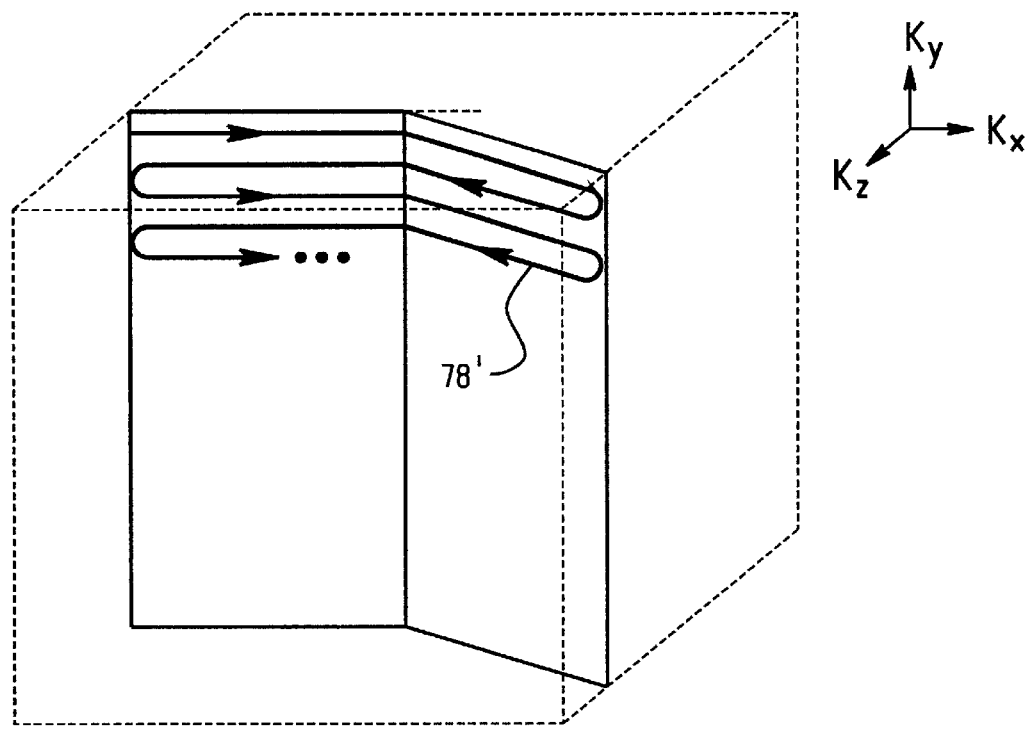
FIGS. 10A and 10B illustrate exemplary embodiments in which the selected pairs of planes or partial planes are shown which are nonsymmetrical with respect to a nominal geometric axis.
Figure 10A:
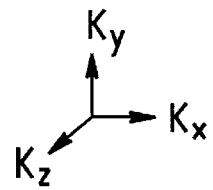
Figure 10B:
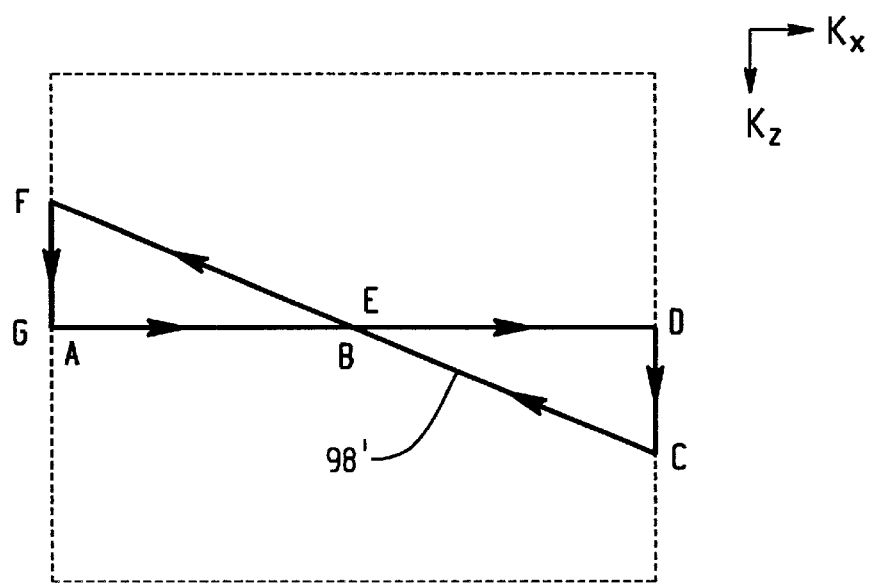
Figure 10B:
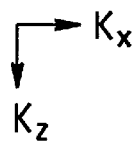

In each of the above described embodiments, the pairs of planes or partial planes are shown which deviate in symmetrical fashion about a nominal geometric axis, however, the present invention does not require that the views be tilted symmetrically about an axis. For example, FIG. 10A illustrates an exemplary trajectory 78' which is a variation of dihedral trajectory 78 (see FIG. 2A) wherein one of the views is aligned with a nominal axis, $k_x$ in the illustrated embodiment, and the other view is skewed therefrom. Similarly, FIG. 10B illustrates an exemplary trajectory 98' which is a variation of bow tie or paddle wheel-shaped trajectory 98 (see FIGS. 5A and 5B), in which one of the views is aligned with a nominal axis, $k_x$ in the illustrated embodiment, and the other view is skewed therefrom. In further embodiments, each view is skewed or tilted non-symmetrically about a nominal axis.

Figure 11A:
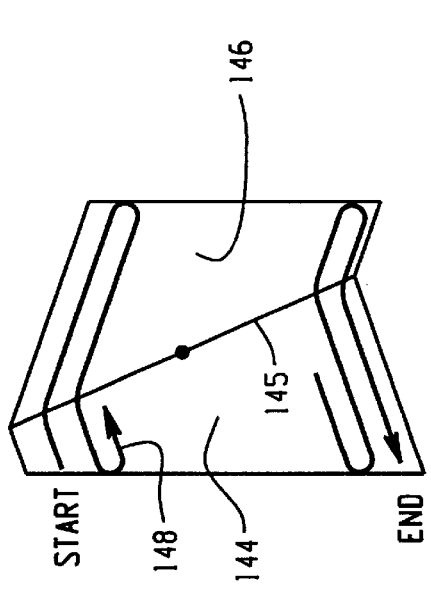
FIGS. 11A and 11B illustrate two embodiments of an angled line of intersection between sampled planes of three-dimensional k-space.
Figure 11B:
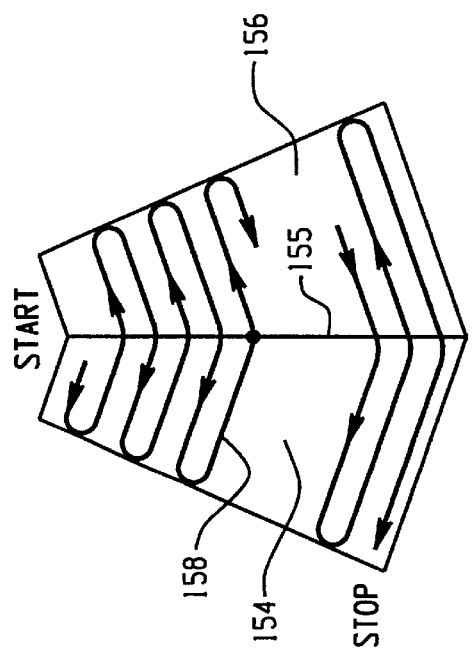

In each of the above described embodiments, the "fold" or intersection of the planes of data collected has been oriented along a nominal axis $k_x=0$ or $k_y=0$. However, it will be recognized that the fold may be oriented in any manner desired. Referring to FIGS. 11A and 11B, there are shown two exemplary embodiments of surfaces formed from two partial planes having an angled intersection or fold. In the embodiment of FIG. 11A, the fold 145 is oriented such that a narrow end of plane 144 butts up against a wide end of plane 146. The trajectory 148 has the characteristic that each traversal across k-space has the same total length.

The embodiment of FIG. 11B varies in that two planes 154 and 156 are oriented in opposing directions, i.e., having a fold 155 oriented such that the narrow end of plane 154 butts up against the narrow end of plane 156 and the wide end of plane 154 butts up against the wide end of plane 156. In this embodiment, the trajectory 158 of k-space gets gradually longer with each cycle. The traversal of k-space advantageously begins with the narrow ends, such that the center of k-space is reached more quickly. Since more acquisition time is spent after having passed the center of k-space, there would be expected to be less accumulated sensitivity to some forms of motion, particularly for larger features.

Figure 12A:
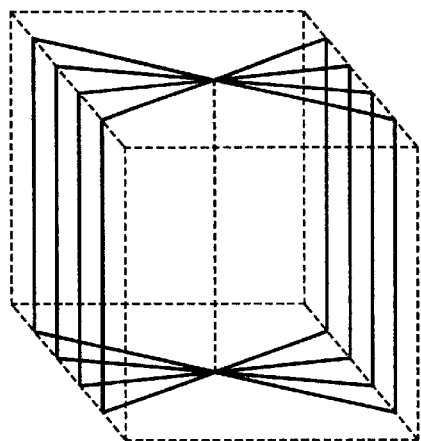
FIGS. 12A and 12B illustrate two embodiments in which more than two planes of data are collected.
Figure 12B:
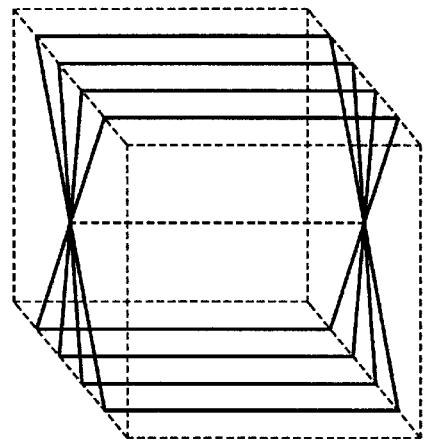

It will also be appreciated that the present invention is not limited to two planes or partial planes of data. Preferably, the number of planes or partial planes collected ranges from 2 to about 8, more preferably from about 2 to about 6. Where more than two planes of data are collected, the acquisition can be performed within a single RF excitation period or by a multishot method wherein a plurality of angularly displaced planes are collected in at least one of the RF excitation periods. FIGS. 12A and 12B illustrate embodiments wherein four intersecting planes of data are collected. Although these embodiments are not described in detail here, the details should be evident to those skilled in the art from the previous discussion, e.g., by extension of the embodiments of FIGS. 5A and 7A. Likewise, more than two partial planes of data may be collected. Where half planes are collected, the remainder of each plane is preferably generated using conjugate symmetry as discussed above.

In the embodiments in which half-planes of data are collected and conjugate symmetry is used, it is preferable that each plane, and thus the line of intersection thereof, passes through the center of k-space. However, collection of data planes in k-space that do not pass through the center of k-space is also contemplated. This produces a phase twist applied to the data along the viewing direction. Thus, collecting planes of data not passing through the center of k-space is, in some instances, advantageous in that the applied phase twist can be useful in reducing background signals from objects of large extent. However, it will be recognized that conjugate symmetry is more difficult, especially for small objects like vessels.

Since each view through the volume is reconstructed separately, there is freedom in choosing how the image-space volume will be translated or centered. This can be done either by applying hardware-based frequency offsets, or by imposing phase factor terms in reconstruction, e.g., linear phase ramps in k-space before the Fourier transforms are done.

The nominal geometric center of the excited volume need not be chosen as the center of the rendered images. For example, in one embodiment, a common key feature or point is identified in both images and is used as the center for both views to make viewing and stereo perception easier. Thus, in an interventional imaging procedure such as needle tracking, catheter tracking, and the like, the needle tip or catheter tip provides the center of the reconstructed views.

For dynamic processes, interventional processes, and some methods such as pulsatile flow or bolus flow, the object of interest exhibits temporal differences in successive images of a time series. Since stereogram imaging is ideal when the features looked at are sparse or small, subtraction of background material of large spatial extent and/or diffuse position may be used for improving stereo perception. Where the position of a feature is advancing, such as a needle tip, catheter tip, etc., the change in position can be accentuated by subtracting a prior image, such as an image from a previous temporal acquisition, or a filtered running average of previous images. In subtracting background images, it may be beneficial to only partially suppress them, for example, by subtracting some percentage, e.g., about 50–90%, preferably about 80%, of a previous image or average filtered image. In this manner, large static features can be substantially suppressed and small dynamic features are easier to distinguish.

The invention has been described with reference to the preferred embodiments. Obviously, modifications and alterations will occur to others upon reading and understanding the preceding detailed description. For example, it is appreciated that many technical variants exist in fast scanning methods and echo planar imaging methods not previously discussed in the description of the preferred embodiments. It is appreciated that sinusoidal waveforms can be replaced by waveforms composed of other shapes such as alternating trapezoidal segments, phase encode blips whose polarities do not alternate can be replaced by lower amplitude constant waveforms, and the like. It is intended that the invention be construed as including all such modifications and alterations insofar as they come within the scope of the appended claims or the equivalents thereof.

Having thus described the preferred embodiments, the invention is now claimed to be:

1. A method of diagnostic imaging comprising:

establishing a polarizing magnetic field in an examination region;

applying a radio frequency pulse to excite magnetic resonance in a volume of interest as a whole;

after exciting magnetic resonance in the whole volume, simultaneously sampling and spatially encoding the excited magnetic resonance, to collect data for a plurality of intersecting planes or partial planes of k-space data, each plane of k-space data corresponding to a differently angled view through the volume of interest, wherein the plurality of planes or partial planes of k-space data are collected without collecting a complete three-dimensional k-space data set.

2. The method of claim 1, wherein the plurality of intersecting planes of k-space data are collected within a single radio frequency excitation period.

3. The method of claim 1, wherein at least a portion of each of the plurality of intersecting planes of k-space data is collected within a single radio frequency excitation period.

4. The method of claim 1, further comprising:

reconstructing each plane of k-space data to form a differently angled projection image representation of a common volume.

5. The method of claim 4, further comprising:

generating, on a human viewable display, a human-viewable image presenting to a human viewer a perception of depth.

6. The method of claim 5, wherein the human-viewable image is selected from a stereographic image and a holographic image.

7. The method of claim 4, further comprising:

generating a first image to be presented to a first eye of a viewer, and generating a second image to be presented to a second eye of a viewer.

8. The method of claim 4, wherein the image is recorded on a print medium selected from a stereographic print medium and a holographic print medium.

9. The method of claim 1, said plurality of planes or partial planes of data comprising two half-planes of data forming a dihedral surface and having a line of intersection therebetween passing through a nominal center of is k-space.

10. The method of claim 9, further including:

generating a full plane data set from each half-plane of data collected using conjugate symmetry.

11. The method of claim 10, further including:

prior to performing conjugate symmetry, for each half-plane of data, approximating uncollected data using a portion of the other half-plane of data.

12. The method of claim 10, wherein the k-space data is collected along a sampling trajectory in k-space comprising one of:

a dihedral spiral trajectory;

lines of data that run orthogonal to the line of intersection between the planes; and lines of data that run parallel to the line of intersection between the planes.

13. The method of claim 9, wherein adjacent lines of data in k-space are of the same gradient frequency encoding polarity.

14. The method of claim 1, the step of sampling and spatially encoding including:

applying first, second, and third magnetic field gradients along first, second, and third mutually orthogonal axes to provide a k-space trajectory and sampling data at periodic intervals along the trajectory, said plurality of planes or partial planes of data comprising two planes of data forming a paddle wheel-shaped surface, the two planes having a line of intersection passing through a nominal center of k-space.

15. The method of claim 14, wherein the k-space trajectory comprises one of:
lines of data that run orthogonal to the line of intersection between the planes; and
lines of data that run parallel to the line of intersection between the planes.

16. The method of claim 9, the step of spatially encoding and sampling comprising:
applying a first magnetic field gradient along a first axis, the first magnetic field gradient being generally sinusoidal and having a generally constant amplitude, the first magnetic field gradient for inducing field echoes and for frequency encoding each echo;
applying a second magnetic field gradient along a second axis orthogonal to the first axis, the second magnetic field gradient being a series of phase encoding blips, each phase encoding blip for stepping each echo to another line of k-space; and
applying a third magnetic field gradient along a third axis orthogonal to the first and second axes, the third gradient being a generally sawtooth waveform so as to perturb the frequency encoding gradient, defining portions of different spatial orientation.

17. In an imaging method in which selected dipoles in a volume of interest are induced to resonate by a radio frequency pulse and in which a series of gradients are applied after application of the radio frequency pulse such that resonance signal data is simultaneously detected and spatially encoded along a preselected data sampling trajectory in three dimensions in k-space, the improvement comprising:
applying the magnetic field gradients such that the data sampling trajectory lies on a plurality of intersecting planes or partial planes of k-space without sampling data for the entire volume of k-space.

18. In the method of magnetic resonance imaging as set forth in claim 17, the improvement further comprising:
configuring the magnetic field gradients such that the trajectory in k-space follows along a surface selected from a dihedral surface and a paddle wheel-shaped surface.

19. A magnetic resonance imaging apparatus comprising:
a magnet system which creates a temporally constant magnetic field through an examination region in which at least a portion of an object to be imaged is placed;
a radio frequency excitation system which applies radio frequency magnetic field excitation to a volume of interest of the object to be imaged;
a receiver system which detects and demodulates magnetic resonance data from the volume of interest; and
a magnetic field encoding system which applies encoding magnetic field gradients to provide spatial discrimination of magnetic resonance data from the volume of interest, the magnetic field encoding system spatially encodes the magnetic resonance signal data along a preselected k-space sampling trajectory, the k-space sampling trajectory covering at least a part of each of two intersecting planes of k-space data.

20. The magnetic resonance imaging apparatus of claim 19, further including:
an image reconstruction processor for reconstructing the magnetic resonance data into an electronic image representation; and
one of a stereographic display system and a holographic display system for outputting the image representation as a human-viewable rendering.

21. The magnetic resonance imaging apparatus of claim 20, wherein the human-viewable display system comprises separate first and second display screens presenting angularly displaced images separately to first and second eyes of a viewer.

22. The magnetic resonance imaging apparatus of claim 19, wherein the preselected k-space trajectory covers two intersecting half-planes of data forming a dihedral surface.

23. A magnetic resonance imaging apparatus comprising:
a means for creating a temporally constant magnetic field through an examination region in which at least a portion of an object to be imaged is placed;
a means for applying radio frequency magnetic field excitation to a volume of interest of the object to be imaged;
a means for detecting and demodulating magnetic resonance data from the volume of interest; and
a means for spatially encoding the magnetic resonance signal data along a preselected k-space read trajectory which coincides with partial planes of data forming a dihedral surface and having a line of intersection therebetween, portions of the trajectory near the line of intersection of said partial planes deviating from said partial planes to traverse a smooth curve between the partial planes.

24. The magnetic resonance imaging apparatus of claim 19, further including:
a conjugate symmetry processor for generating a full plane of k-space data from each half plane of k-space data collected.

25. The magnetic resonance imaging apparatus of claim 19, wherein said preselected k-space trajectory covers two planes forming a paddle wheel-shaped surface, the two planes having a line of intersection passing through a nominal center of k-space.

26. The method of claim 1, wherein said sampling and spatially encoding further comprises collecting, along a pre-selected k-space trajectory, two partial planes of k-space data forming a dihedral surface with a smooth curving transition between the partial planes.

27. A method of diagnostic imaging comprising:
establishing a polarizing magnetic field in an examination region;
applying a radio frequency pulse to excite magnetic resonance in a volume of interest as a whole;
after exciting magnetic resonance in the whole volume, simultaneously sampling and spatially encoding the excited magnetic resonance, to collect data for two half-planes of k-space data forming a dihedral surface and having a line of intersection therebetween passing through a nominal center of k-space;
generating a full plane data set from each half-plane of data collected using conjugate symmetry; and
the k-space data collected along a sampling trajectory comprising one of:
a dihedral spiral trajectory;
lines of data that run orthogonal to the line of intersection between the planes; and
lines of data that run parallel to the line of intersection between the planes.

28. A method of diagnostic imaging comprising:
establishing a polarizing magnetic field in an examination region;
applying a radio frequency pulse to excite magnetic resonance in a volume of interest as a whole;

after exciting magnetic resonance in the whole volume, simultaneously sampling and spatially encoding the excited magnetic resonance, to collect k-space data;

said k-space data collected along a k-space trajectory covering two half-planes of data forming a dihedral surface and having a line of intersection therebetween passing through a nominal center of k-space; and said k-space trajectory having adjacent lines of k-space data which are of the same gradient frequency encoding polarity.

29. A method of diagnostic imaging comprising:

establishing a polarizing magnetic field in an examination region;

applying a radio frequency pulse to excite magnetic resonance in a volume of interest as a whole;

after exciting magnetic resonance in the whole volume, simultaneously sampling and spatially encoding the excited magnetic resonance, to collect data for a plurality of intersecting planes or partial planes of k-space data, each plane of k-space data corresponding to a differently angled view through the volume of interest, wherein the plurality of planes or partial planes of k-space data are collected without collecting a complete three-dimensional k-space data set, and further wherein adjacent lines of k-space data have the same gradient frequency encoding polarity.

30. A method of diagnostic imaging comprising:

establishing a polarizing magnetic field in an examination region;

applying a radio frequency pulse to excite magnetic resonance in a volume of interest as a whole;

after exciting magnetic resonance in the whole volume, spatially encoding the excited magnetic resonance by applying first, second, and third magnetic field gradients along first, second, and third mutually orthogonal axes to define a k-space trajectory;

the first magnetic field gradient, along the first axis, being generally sinusoidal and having a generally constant amplitude, the first magnetic field gradient for inducing field echoes and for frequency encoding each echo;

the second magnetic field gradient, along the second axis, being a series of phase encoding blips, each phase encoding blip for stepping each echo to another line of k-space;

the third magnetic field gradient, along the third axis, being a generally sawtooth waveform so as to perturb the frequency encoding gradient, defining portions of different spatial orientation; and sampling k-space data at periodic intervals to collect data along the k-space trajectory which lies along a plurality of intersecting planes or partial planes corresponding to a differently angled view through the volume of interest without collecting a complete three-dimensional k-space data set.

* * * * *